United States Patent
Soyano

(10) Patent No.: US 9,603,291 B2
(45) Date of Patent: Mar. 21, 2017

(54) SEMICONDUCTOR DEVICE

(71) Applicant: FUJI ELECTRIC CO., LTD., Kawasaki-shi, Kanagawa (JP)

(72) Inventor: Shin Soyano, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 81 days.

(21) Appl. No.: 14/634,055

(22) Filed: Feb. 27, 2015

(65) Prior Publication Data
US 2015/0201532 A1    Jul. 16, 2015

Related U.S. Application Data

(63) Continuation of application No. PCT/JP2013/079143, filed on Oct. 28, 2013.

(30) Foreign Application Priority Data

Oct. 29, 2012 (JP) ................................. 2012-238285
Jun. 28, 2013 (JP) ................................. 2013-136279

(51) Int. Cl.
H05K 9/00 (2006.01)
H05K 7/14 (2006.01)
(Continued)

(52) U.S. Cl.
CPC ......... H05K 9/0022 (2013.01); H01L 23/552 (2013.01); H01L 25/165 (2013.01);
(Continued)

(58) Field of Classification Search
CPC .. H05K 9/0022; H05K 9/0037; H05K 7/1427; H05K 7/1432; H01L 23/552;
(Continued)

(56) References Cited

U.S. PATENT DOCUMENTS 5,018,050 A * 5/1991 Maenishi ............... H05K 7/209
                                                          335/202
8,698,287 B2    4/2014 Soyano
(Continued)

FOREIGN PATENT DOCUMENTS

CN    201562217 U    8/2010
CN    102270615 A    12/2011
(Continued)

OTHER PUBLICATIONS

Europe Patent Office, "Search Report for European Patent Application No. 13851700.8," Jun. 28, 2016.
(Continued)

Primary Examiner — Jayprakash N Gandhi
Assistant Examiner — Yahya Ahmad
(74) Attorney, Agent, or Firm — Manabu Kanesaka

(57) ABSTRACT

A semiconductor device includes a semiconductor element accommodated in an outer case; a control circuit board fixed to the outer case at a position away from the semiconductor element; and a shield plate provided between the semiconductor element and the control circuit board. The outer case is provided with a support having a convex portion longer than a thickness of the shield plate at a distal end thereof. The shield plate is formed with a through-hole in which the convex portion of the support passes through. The shield plate is fixed to the support with a fixing device engaging with the convex portion.

11 Claims, 27 Drawing Sheets

(51) Int. Cl.
*H01L 25/16* (2006.01)
*H01L 23/552* (2006.01)
*H02M 7/00* (2006.01)

(52) U.S. Cl.
CPC ......... *H05K 7/1427* (2013.01); *H05K 7/1432* (2013.01); *H05K 9/0037* (2013.01); *H01L 2224/4846* (2013.01); *H01L 2224/48091* (2013.01); *H01L 2224/48137* (2013.01); *H01L 2224/48472* (2013.01); *H01L 2924/1305* (2013.01); *H01L 2924/13055* (2013.01); *H01L 2924/181* (2013.01); *H01L 2924/19107* (2013.01); *H02M 7/003* (2013.01)

(58) Field of Classification Search
CPC ............ H01L 25/165; H01L 2924/181; H01L 2924/1305; H01L 2924/13055; H01L 2924/19107; H01L 2224/48091; H01L 2224/4846; H01L 2224/48472; H01L 2224/4813; H01L 25/18; H01L 2924/0002; H02M 7/003; H02M 7/48
USPC .................................................. 361/748–804
See application file for complete search history.

(56) References Cited

U.S. PATENT DOCUMENTS

| 8,829,534 | B2 | 9/2014 | Kikuchi | |
|---|---|---|---|---|
| 2002/0024120 | A1 | 2/2002 | Yoshimatsu et al. | |
| 2006/0044762 | A1* | 3/2006 | Kikuchi | H01L 25/162 |
| | | | | 361/704 |
| 2006/0067059 | A1* | 3/2006 | Ushijima | H01L 25/162 |
| | | | | 361/715 |
| 2009/0002974 | A1* | 1/2009 | Yahata | B60L 15/20 |
| | | | | 361/820 |
| 2010/0133681 | A1* | 6/2010 | Oka | H01L 23/041 |
| | | | | 257/693 |
| 2011/0096516 | A1* | 4/2011 | Li | G06F 1/184 |
| | | | | 361/752 |
| 2012/0074542 | A1* | 3/2012 | Soyano | H01L 23/057 |
| | | | | 257/659 |
| 2014/0355219 | A1* | 12/2014 | Tada | H01L 24/01 |
| | | | | 361/729 |
| 2016/0157351 | A1* | 6/2016 | Taya | H05K 5/02 |
| | | | | 361/752 |

FOREIGN PATENT DOCUMENTS

| CN | 102439720 A | 5/2012 | | |
|---|---|---|---|---|
| JP | H07-007965 A | 1/1995 | | |
| JP | 2004-022705 A | 1/2004 | | |
| JP | 2006-074853 A | 3/2006 | | |
| JP | 2007-258068 A | 10/2007 | | |
| JP | 2007-266527 A | 10/2007 | | |
| JP | 2008-301608 A | 12/2008 | | |
| JP | 2009-130163 A | 6/2009 | | |
| JP | 4583122 B2 | 11/2010 | | |
| JP | WO 2010150471 A1 * | 12/2010 | ........... | H01L 23/057 |
| WO | 2010/150471 A1 | 12/2010 | | |

OTHER PUBLICATIONS

PCT, "International Search Report for International Application No. PCT/JP2013/079143".

China Patent Office, "Office Action for Chinese Patent Application No. 201380046902.2," Nov. 1, 2016.

* cited by examiner

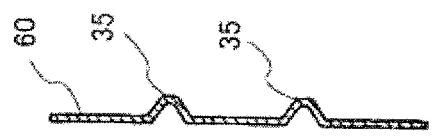
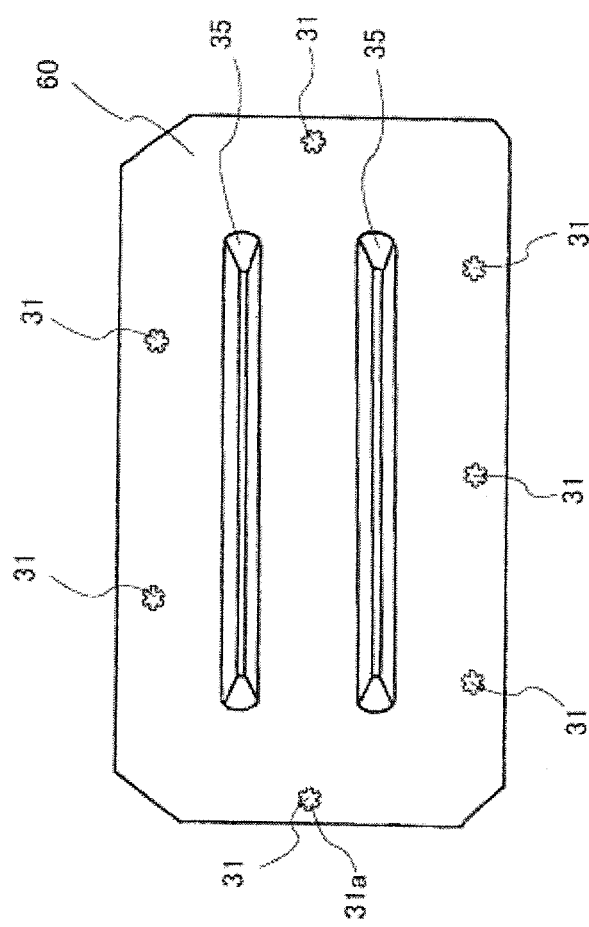
FIG. 24(b)
FIG. 24(a)

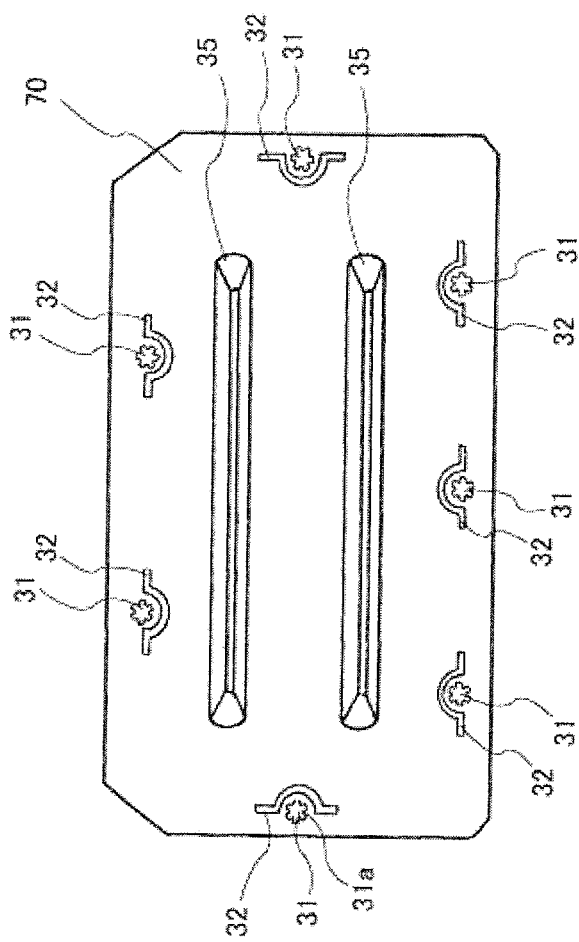

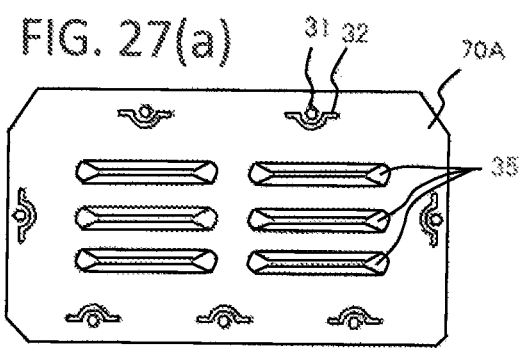
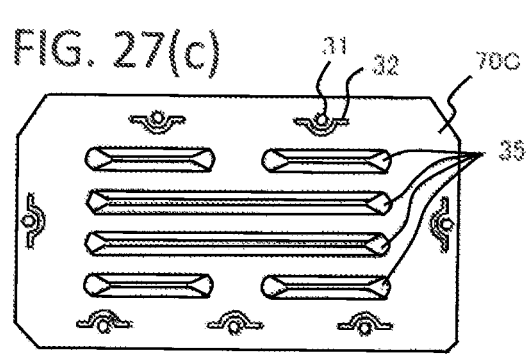
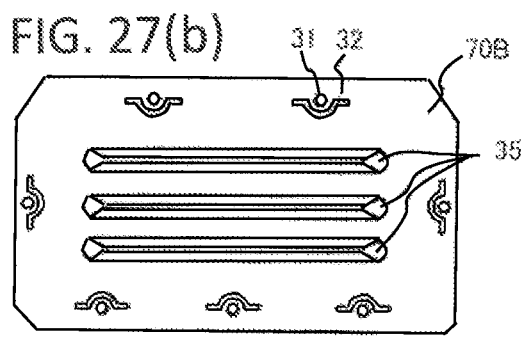
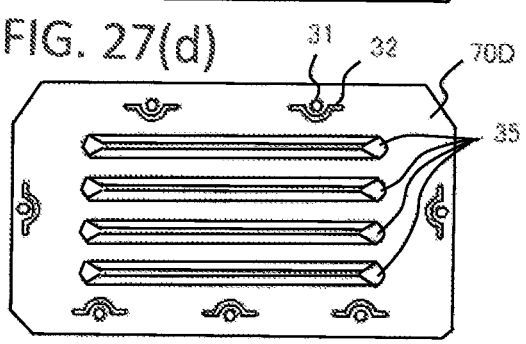
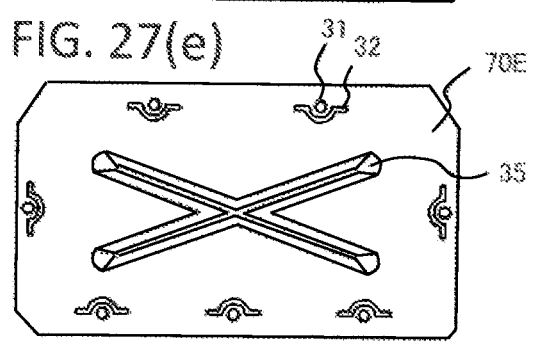
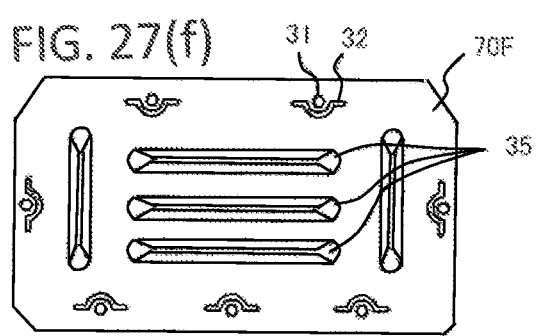

SEMICONDUCTOR DEVICE

RELATED APPLICATIONS

The present application is a Continuation Application of International Application No. PCT/JP2013/079143 filed Oct. 28, 2013, and claims priority from Japanese Application Nos. 2012-238285 filed Oct. 29, 2012, and 2013-136279 filed Jun. 28, 2013.

TECHNICAL FIELD

The present invention relates to a semiconductor device, and more particularly, to a semiconductor device in which a control circuit board is fixed to an outer case that accommodates a power semiconductor element.

BACKGROUND ART

A semiconductor module in which a power semiconductor element such as an insulated gate bipolar transistor (IGBT) is built into an outer case made from a resin is known as an example of a semiconductor device that controls a motor or the like. A semiconductor module including a control circuit board that controls a power semiconductor element is also known. In a power semiconductor module that includes a control circuit board, noise generated during a switching operation of a power semiconductor element may have an influence on the control circuit board and the power semiconductor element. Thus, the control circuit board is fixed to the outer case to be separated from the power semiconductor element such that the influence of noise does not reach. The control circuit board is fixed to an outer side of the outer case with screws, for example.

Higher operating speed, smaller size, and lower power consumption required for recent electronic devices are stringent requirements for noise resistance of electronic devices against external noise. Moreover, the sources of external noise are ever increasing, and the demand for noise resistance of electronic devices becomes stronger as well as removal of interfering noise, which has been demanded in the past. In particular, on-vehicle electronic devices (on-vehicle intelligent power modules and the like) used in severe environments require stricter anti-noise countermeasures than the conventional level because of the requirements demanded by manufacturers.

Thus, anti-noise countermeasures are taken on a control circuit board for controlling a power semiconductor element or the like, or a shield plate is arranged between the power semiconductor element and the control circuit board. As the former anti-noise countermeasures on the control circuit board side, a metal foil is attached to the entire surface of the control circuit board close to the outer case and is electrically connected to the ground, or circuits or patterns are designed as anti-noise countermeasures, or components for anti-noise countermeasures such as capacitors are provided.

As the latter anti-noise countermeasures of arranging the shield plate, a semiconductor device in which the shield plate is fixed by screwing is known (Patent Literature 1). Moreover, a semiconductor device in which a print board having a shield layer is fixed by screwing to external connection terminals is fixed and supported on an outer case (Patent Literature 2). Moreover, there is a semiconductor device in which a shield plate is mounted on the ends of step supports implanted in an outer case, a metal ring is placed so that a coupling portion of each of the step supports passes through the metal ring, a control circuit board is mounted on the metal rings, the control circuit board and the shield plate overlapped in two stages are fixed by screwing to the step supports (Patent Literature 3). Since these semiconductor devices have the shield plate arranged between the power semiconductor element and the control circuit board, it is possible to suppress noise radiating from one of the power semiconductor element and the control circuit board from entering into the other by being partially blocked by the shield plate. A metal plate made from a material corresponding to the properties of noise is used as the shield plate, and it is possible to effectively block noise.

Patent Literature 1: Japanese Patent No. 4583122
Patent Literature 2: Japanese Patent Application Publication No. 2009-130163
Patent Literature 3: WO 2010/150471

The semiconductor devices disclosed in Patent Literature 1 to 3 use metal screws or metal rings in order to fix the shield plate. Thus, since metal components are used, it is necessary to design by taking a separation distance between the shield plate and the control circuit board mounted above the shield plate into consideration and to prepare a void distance corresponding to a screw height between the shield plate and the control circuit board. Therefore, the overall height of the semiconductor device having the control circuit board increases and the volume increases.

DISCLOSURE OF THE INVENTION

The present invention solves the above problems advantageously, and an object thereof is to provide a semiconductor device having a control circuit board, capable of fixing a shield plate without using screws and reducing the thickness and the size.

In order to attain the object, a semiconductor device having the following configuration is provided.

The semiconductor device includes: a semiconductor element accommodated in an outer case; a control circuit board fixed to the outer case at a position away from the semiconductor element; and a shield plate provided between the semiconductor element and the control circuit board. The outer case is provided with a support having a convex portion longer than a thickness of the shield plate at a distal end thereof. The shield plate is formed with a through-hole in which the convex portion of the support passes through. The shield plate is fixed to the support with a fixing device ('fixing means') engaging with the convex portion.

According to the present invention, the support is provided on the outer case in which the semiconductor element is accommodated, the convex portion of the support passes through the shield plate, and the shield plate is fixed to the support by the fixing device that engages with the convex portion. Thus, the shield plate can be fixed without using screws. Therefore, it is possible to reduce the thickness and the size of the semiconductor device having the control circuit board.

BRIEF DESCRIPTION OF THE DRAWINGS

FIGS. 24A and 24B are diagrams for describing a shield plate of the semiconductor device according to the sixth embodiment of the present invention.

FIGS. 26A and 26B are plan views of a shield plate of a semiconductor device according to a seventh embodiment of the present invention.

FIGS. 27A to 27F are plan views illustrating modifications of the shield plate illustrated in FIGS. 26A and 26B.

BEST MODE FOR CARRYING OUT THE INVENTION (First Embodiment)

Embodiments of the semiconductor device of the present invention will be described in detail with reference to the drawings.

Figure 1:
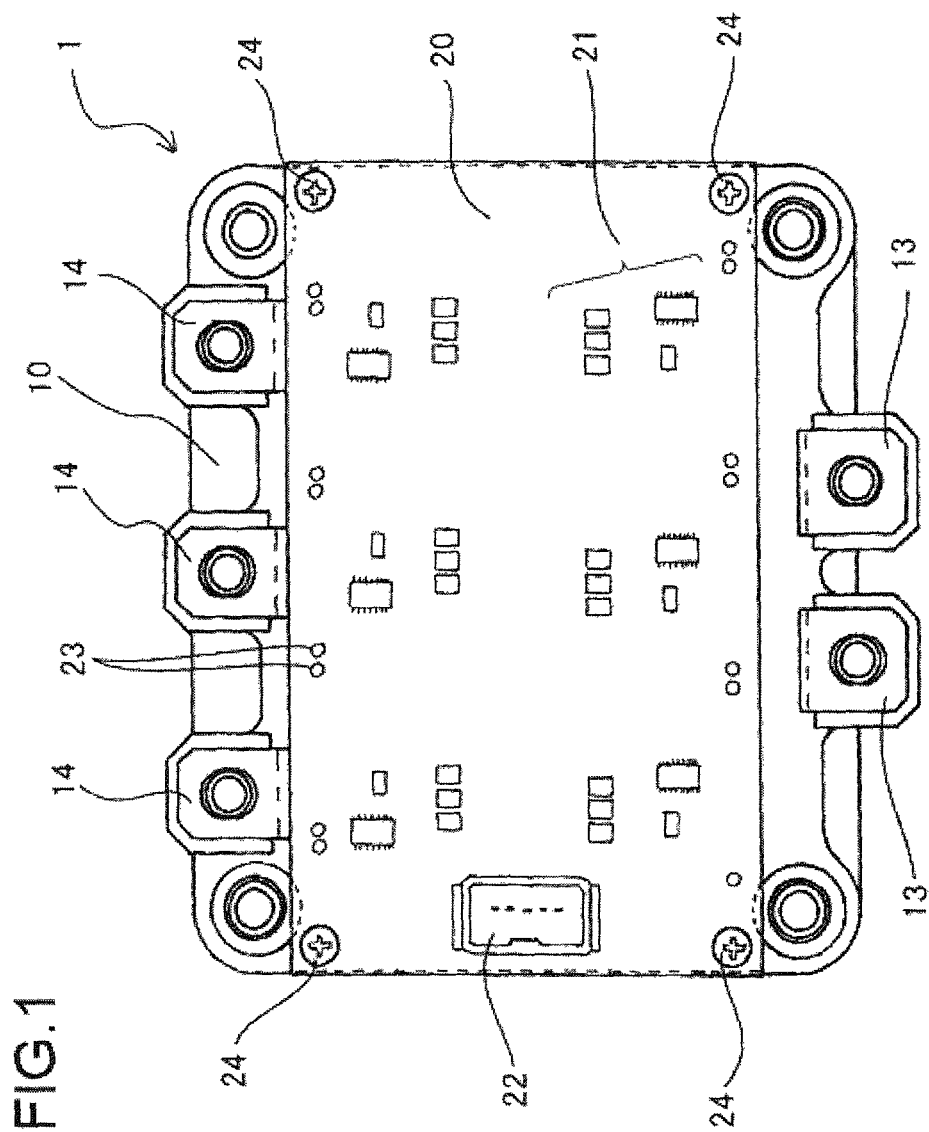
FIG. 1 is a plan view of an embodiment of a semiconductor device according to the present invention.
Figure 2:
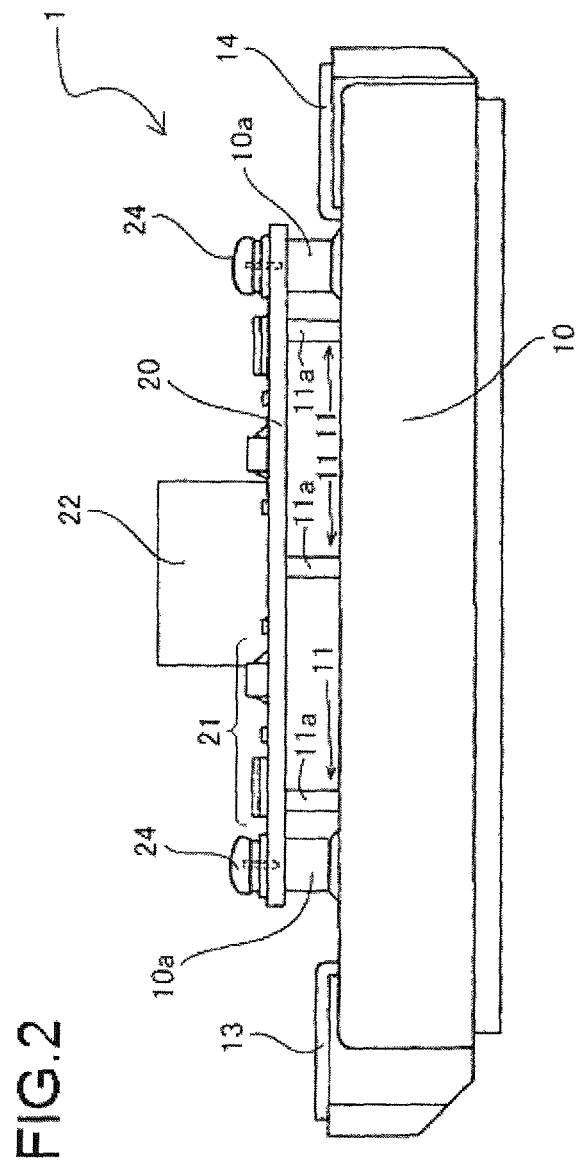
FIG. 2 is a side view of the semiconductor device illustrated in FIG. 1.

A semiconductor device 1 according to an embodiment of the present invention, illustrated by a plan view in FIG. 1 and a side view in FIG. 2 is configured as an intelligent power module (IPM) applied in an inverter device, in which a control circuit board 20 is provided on an outer case 10 that is made from a resin and accommodates a power semiconductor element (chip). The control circuit board 20 has a rectangular shape in a plan view, in which a plurality of electronic components 21 that forms a driving circuit and a control circuit of the power semiconductor element and a connector 22 for external electric connection are mounted on one surface of the board, and pin terminals 23 are extended from the outer case 10. The electronic components 21 illustrated are depicted in a simplified manner for better understanding.

A wiring pattern (not illustrated) formed from conductive metal and connected to the plurality of electronic components 21 is formed on the other surface (rear surface) of the control circuit board 20. The control circuit board 20 is fixed to the outer case 10 by screwing screws 24 attached to four corners of the control circuit board 20 to screw seats 10a (see FIG. 2) formed on the upper end on the front surface side of the outer case 10. Referring to FIG. 2, distal ends of convex (projection) portions 11a of pin-shaped supports 11 protruding toward the front surface from the outer case 10 are contacting the rear surface of the control circuit board 20 fixed by the screws 24. In this way, vibration of the control circuit board 20 is suppressed. The support 11 which will be described later is used for fixing a shield plate 30 illustrated in FIG. 3 by an annular fastener 12. A plurality of terminals (screw terminals) 13 and 14 electrically connected to the power semiconductor element (chip) and the like in the outer case 10 is exposed from the upper end of the outer case 10.

Figure 3:
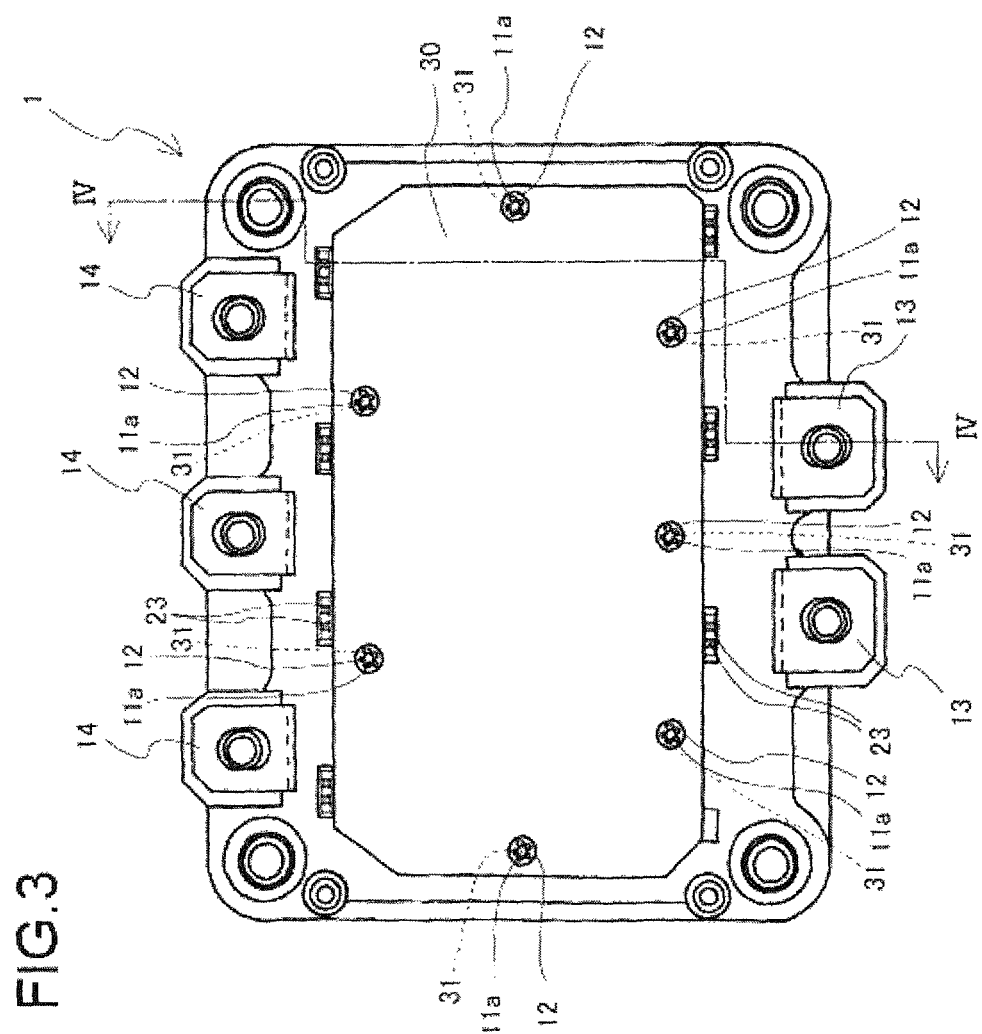
FIG. 3 is a plan view illustrating a state where a control circuit board illustrated in FIG. 1 is removed.

FIG. 3 illustrates a plan view illustrating a state where the control circuit board 20 illustrated in FIG. 1 is removed. The semiconductor device 1 includes the shield plate 30 which is provided in a lower portion than the upper end of the outer case 10. That is, the shield plate 30 is accommodated in the outer case 10. A plurality of through-holes 31 (not illustrated in the figure) through which the convex portions 11a of the supports 11 pass is formed in the periphery of the shield plate 30. The convex portions 11a of the supports 11 pass through the through-holes 31 of the shield plate 30 and protrude toward the control circuit board 20 (the front surface of the shield plate 30). In the present embodiment, the through-hole 31 has a circular shape having such a diameter that the convex portion 11a of the support 11 can be inserted. An annular fastener 12 as fixing means of the present invention is attached so as to engage with the protruding convex portion 11a, and the shield plate 30 is fixed to the support 11 by the annular fastener 12.

Figure 4:
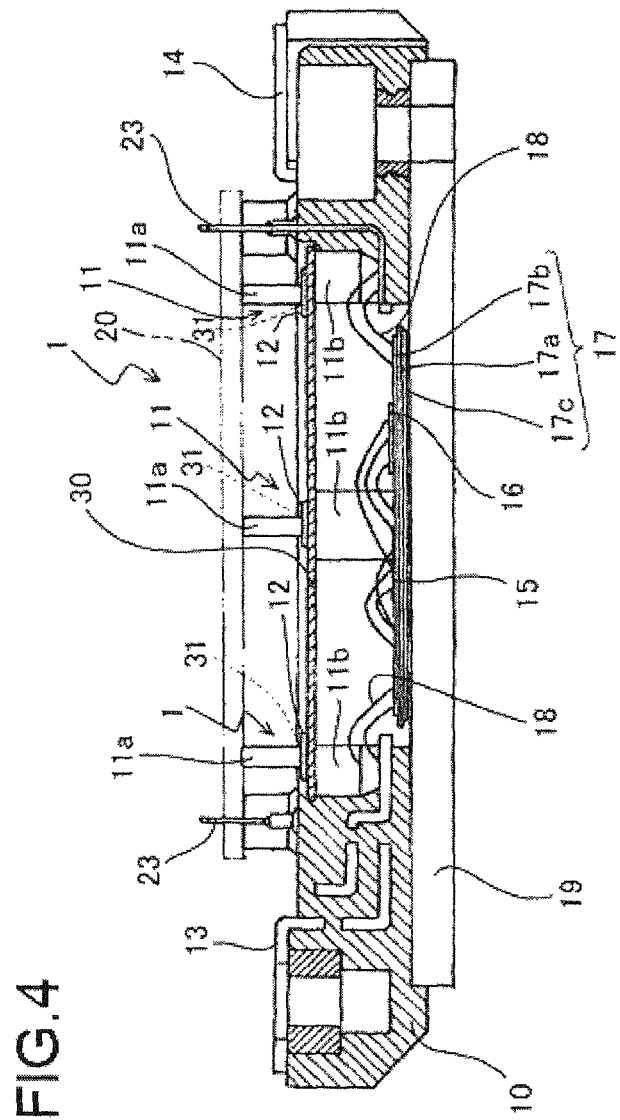
FIG. 4 is a cross-sectional view along the line IV-IV in FIG. 3.

FIG. 4 illustrates a cross-sectional view along the line IV-IV in FIG. 3. The semiconductor device 1 includes a plurality of semiconductor elements 15 and 16 in the outer case 10 made from a resin. The semiconductor elements 15 and 16 may be an insulated gate bipolar transistor (IGBT) and a free wheeling diode (FWD), respectively. These semiconductor elements 15 and 16 are mounted on an insulating substrate 17. The insulating substrate 17 includes an insulating layer 17a and conductor layers 17b and 17c formed on both surfaces of the insulating layer 17a. The semiconductor elements 15 and 16 are connected to the conductor layer 17b in which a circuit pattern is formed and are connected to a plurality of bonding wires 18, and an inverter circuit, for example, is formed as a primary circuit. The primary circuit formed is electrically connected to the terminals 13 and 14 in the portion inserted in the outer case 10 by the bonding wires 18. Moreover, the auxiliary circuit of the semiconductor elements 15 and 16 is electrically connected to the pin terminals 23 by the bonding wires 18. The conductor layer 17c of the insulating substrate 17 is bonded to the metal substrate 19 by solders. The outer case 10 is attached onto the metal substrate 19.

Figure 5:
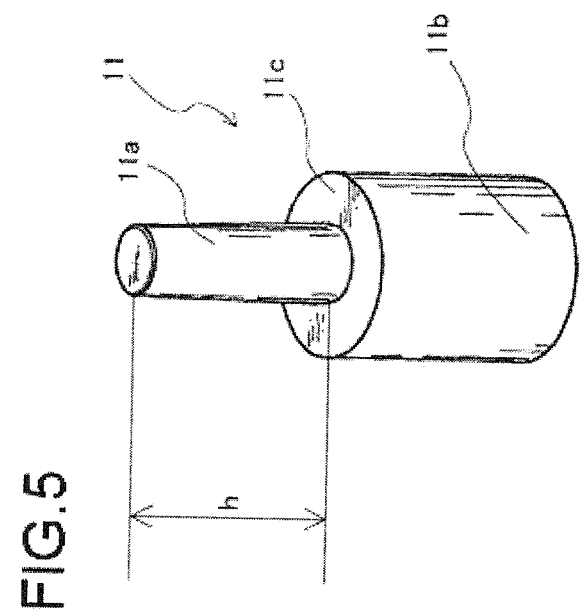
FIG. 5 is a perspective view of a support.

As illustrated by a perspective view in FIG. 5, the support 11 formed in the outer case 10 includes a convex portion 11a that passes through the through-hole 31 formed in the shield plate 30 and a base portion 11b which is connected to the convex portion 11a and has a larger diameter than the convex portion 11a. A flat portion 11c is formed between the convex portion 11a and the base portion 11b. The shield plate 30 is placed on the flat portion 11c with the convex portion 11a passing through the shield plate 30, whereby the shield plate 30 is supported.

The support 11 is provided in the outer case 10 by being molded integrally with the outer case 10. However, the support 11 is not limited to that molded integrally with the outer case 10. For example, one or a plurality of supports 11 may be formed on a plate or a frame that is formed separately from the outer case 10, and the plate or the frame may be accommodated in the outer case 10. In the present embodiment illustrated in FIG. 3, the position in the outer case 10 where the support 11 is formed is a position that is within the outer case 10 and corresponds to the periphery of the shield plate 30. However, the position may be in a central portion of the shield plate 30 as long as the support 11 does not interfere with wires of the semiconductor elements 15 and 16 accommodated in the outer case 10. Moreover, the support 11 may be provided on the upper end of the outer wall of the outer case 10.

The support 11 is molded integrally with the outer case 10 and is made from the same resin as the outer case 10. The support 11 may be made from metal. When the support 11 is made from metal, in the present embodiment, since the distal end of the convex portion 11a is contacting the control circuit board 20, it is necessary to take insulation between the support 11 and the control circuit board 20 into consideration. Thus, the support 11 is preferably made from a resin. The support 11 may be configured such that the distal end of the convex portion 11a is not contacting the control circuit board 20, and in this case, it is not necessary to take insulation of the metal support 11 into consideration.

The height h of the convex portion 11a of the support 11 is longer than the thickness of the shield plate 30 and has such a length that the convex portion 11a protrudes through the through-hole 31 of the shield plate 30. Specifically, the height is determined as a length required as the distance between the shield plate 30 placed on the flat portion 11c of the support 11 and the control circuit board 20 contacting the distal end of the convex portion 11a of the support 11. The convex portion 11a of the support 11 has an approximately cylindrical shape and has such a tapered shape that narrows as the convex portion 11a advances toward the distal end. The diameter of the convex portion 11a of the support 11 may be approximately the same as the diameter of a screw portion of a screw used for screwing a shield plate of a conventional semiconductor device.

In the support 11 illustrated in FIG. 5, the base portion 11b has a cylindrical shape having the same central axis as the convex portion 11a. The base portion 11b of the support 11 is not limited to the shape illustrated but may have a prismatic shape and other shape as long as the base portion 11b has a larger cross-sectional area than the convex portion 11a and the flat portion 11c is formed in the portion connected to the convex portion 11a. The diameter of the base portion 11b may be approximately the same as the diameter of a nut coupled with a screw used for screwing a shield plate of a conventional semiconductor device, for example.

Figure 6:
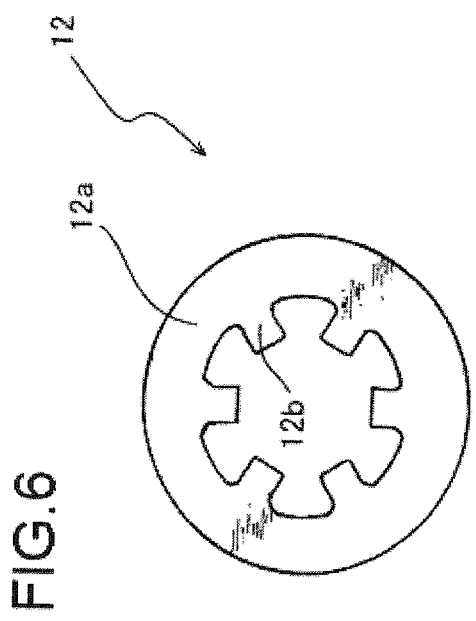
FIG. 6 is a plan view of an annular fastener.

An example of the annular fastener 12 attached to the convex portion 11a of the support 11 in order to fix the shield plate 30 to the support 11 has a configuration in which a plurality of claws 12b is formed on the inner circumference of a ring portion 12a as illustrated by a plan view in FIG. 6. A diameter of a circle contacting distal ends of the respective claws 12b may be slightly smaller than the diameter in the base of a portion of the convex portion 11a of the support 11 protruding from the shield plate 30. The annular fastener 12 may be made from metal. The claw 12b may have a trapezoidal shape that protrudes toward the center when seen in the plan view as illustrated in FIG. 6 and may have a triangular shape that protrudes toward the center, for example. Moreover, an annular fastener which has a polygonal hole instead of the claws 12b and in which the diameter of an inscribed circle of the hole is slightly smaller than the diameter in the base of the convex portion 11a and respective sides of the hole bite into the convex portion 11a may be used as the annular fastener 12. Moreover, the shape (outer shape) on the outer circumference side of the annular fastener 12 of the present invention is not limited to a circular shape but may be a polygonal shape or the like as long as the respective claws 12b on the inner circumference side of the ring portion 12a bite into the support 11 whereby the shield plate 30 is fixed to the support 11.

Figure 7:
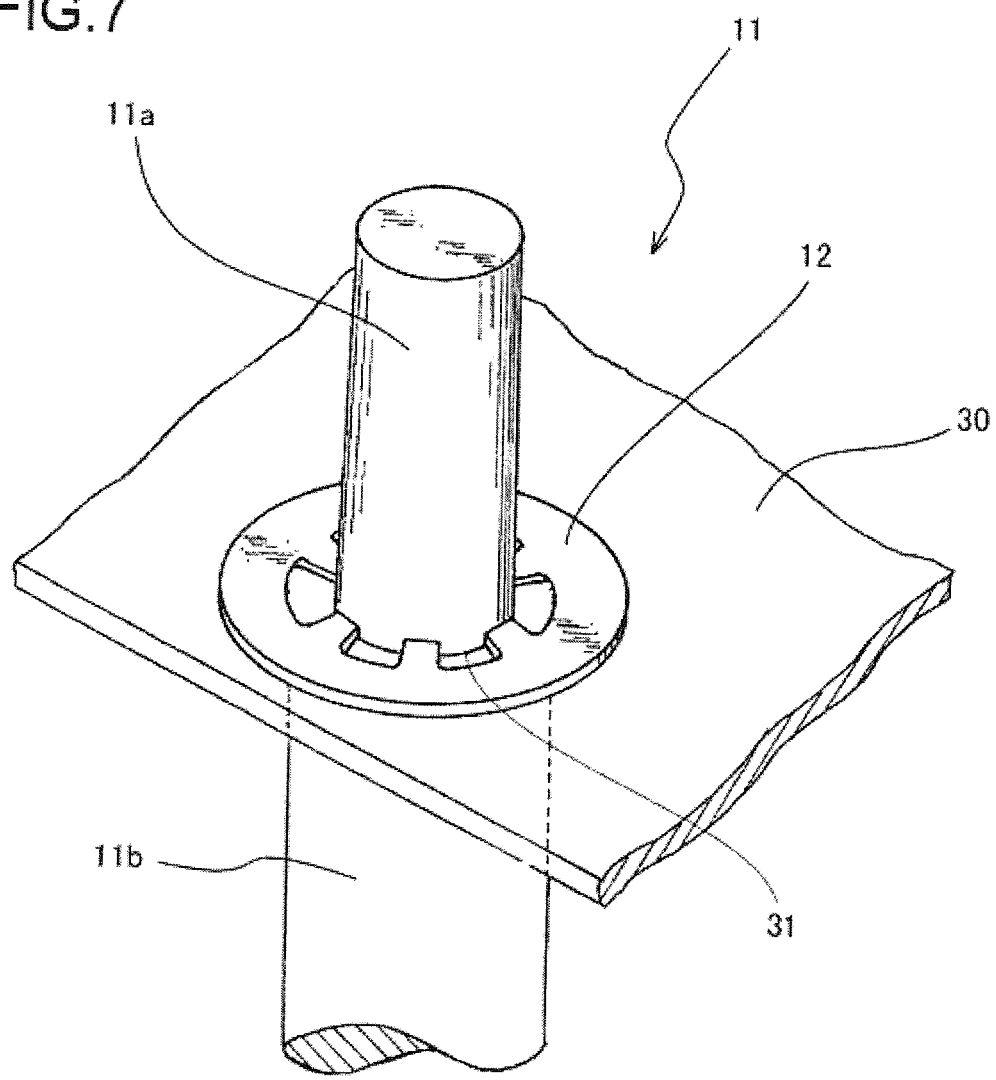
FIG. 7 is a perspective view when the annular fastener is attached to the support 11.

A state where the annular fastener 12 is attached to the support 11 is illustrated by a schematic perspective view in FIG. 7. The convex portion 11a of the support 11 protrudes through the through-hole 31 of the shield plate 30. The annular fastener 12 is moved toward the base of the convex portion 11a along the convex portion 11a protruding through the hollow portion of the annular fastener 12 until the annular fastener 12 contacts the shield plate 30. By doing so, the claws 12b of the annular fastener 12 bite into the convex portion 11a. In this way, the movement of the annular fastener 12 in an axial direction of the convex portion 11a is restricted, and as a result, the movement of the shield plate 30 in the axial direction of the convex portion 11a is restricted. Thus, the shield plate 30 is fixed to the support 11.

In the semiconductor device 1 of the present embodiment, since the shield plate 30 is fixed by the convex portion 11a of the support 11 and the annular fastener 12, it is not necessary to screw the shield plate 30. Thus, it is possible to reduce the thickness and the size of the semiconductor device 1 having the control circuit board 20. Specifically, the thickness of the semiconductor device 1 of the present embodiment can be reduced at least by 5 mm as compared to the conventional semiconductor device in which the shield plate 30 is screwed.

In the semiconductor device 1 of the present embodiment, since the shield plate 30 can be fixed just by attaching the annular fastener 12 to the convex portion 11a of the support 11, assembling workability is improved as compared to the screwing method. Moreover, since the annular fastener 12 is not expensive, it is possible to reduce the component cost. Further, since the improvement of the outer case 10 is achieved by a simple structure of providing the support 11, it is possible to reduce the number of components and the cost as compared to the screwing method. Furthermore, although the screwing method involves forming female screw holes in the screw seats of the outer case, a sealing material may enter into the holes of the screw seats when the semiconductor elements in the outer case are sealed by a sealing resin. Due to this, it is necessary to form the screw seats at a higher position of the outer case so that the sealing material does not enter into the screw seats. In this respect, it is difficult to reduce the height of the shield plate and the height of the outer case. In contrast, in the semiconductor device 1 of the present embodiment, the support 11 formed on the outer case 10 does not have a hole, and it is not necessary to take entrance of the sealing material into consideration. Thus, it is possible to provide the shield plate 30 in the outer case 10 and to reduce the height of the outer case.

Further, in the semiconductor device 1 of the present embodiment, the distal end of the convex portion 11*a* of the support 11 is configured to contact the control circuit board 20. As a result, it is possible to suppress vibration of the control circuit board 20. In particular, the vibration suppressing efficiency of the support 11 is large when the control circuit board 20 has a large size.

Figure 8:
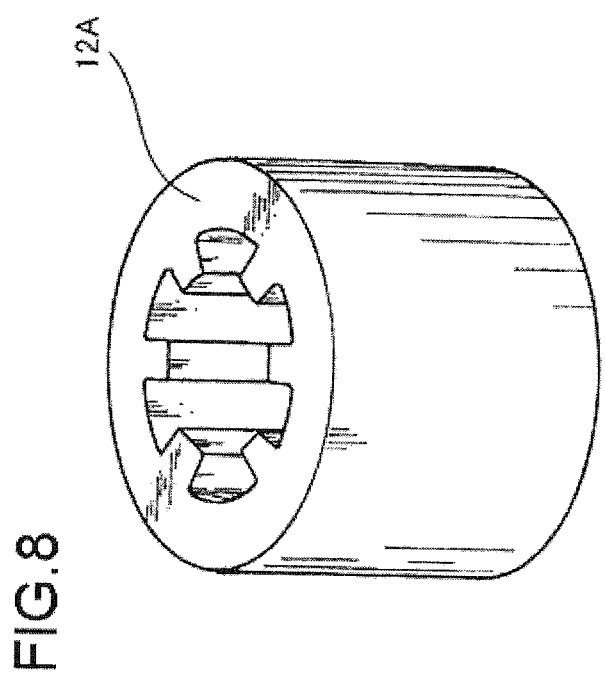
FIG. 8 is a schematic perspective view illustrating another example of the annular fastener.
Figure 9:
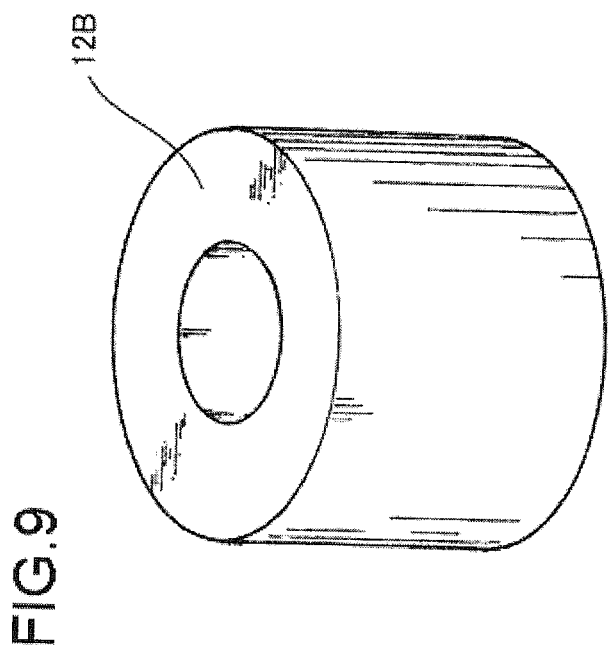
FIG. 9 is a schematic perspective view illustrating another example of the annular fastener.
Figure 10:
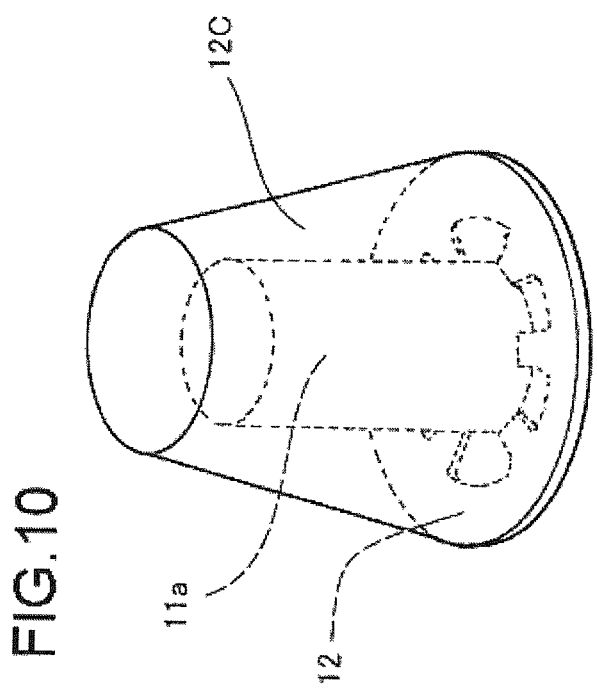
FIG. 10 is a schematic perspective view illustrating another example of the annular fastener.

The annular fastener is not limited to a donut-shaped fastener illustrated in FIG. 6. For example, as illustrated by a schematic perspective view in FIG. 8, an annular fastener 12A having a larger thickness than the annular fastener illustrated in FIG. 6 may be used. Moreover, a cylindrical annular fastener 12B which has a similar outer shape to the annular fastener 12A and has a straight through-hole as illustrated by a schematic perspective view in FIG. 9, for example, and which is tightly fitted to the convex portion 11*a* may be used. Further, a cap-shaped annular fastener 12C that covers the convex portion 11*a* of the support 11 as illustrated by a schematic perspective view in FIG. 10 maybe used. The cap-shaped annular fastener 12C preferably has such dimensions that the upper end of the annular fastener 12C contacts the shield plate 30 when the annular fastener 12C is attached to the convex portion 11*a* of the support 11.

The shield plate 30 is formed of a plate made from a material such as aluminum, copper, or iron. In order to provide electric insulation, the shield plate 30 is preferably insert-molded from an insulating resin. Polyphenylene sulfide (PPS) or polybutylene terephthalate (PBT) is used as the resin. Moreover, an insulating sheet may be attached to the shield plate 30 instead of the resin. Further, an electromagnetic wave absorbing sheet may be attached to at least one surface of the shield plate 30 instead of the resin.

When it is desirable to electrically connect the shield plate 30 to the ground line of the control circuit board 20 as anti-noise countermeasures, at least one of the supports 11 may be made from metal so that the shield plate 30 and the control circuit board are electrically connected.

(Second Embodiment)

Figure 11:
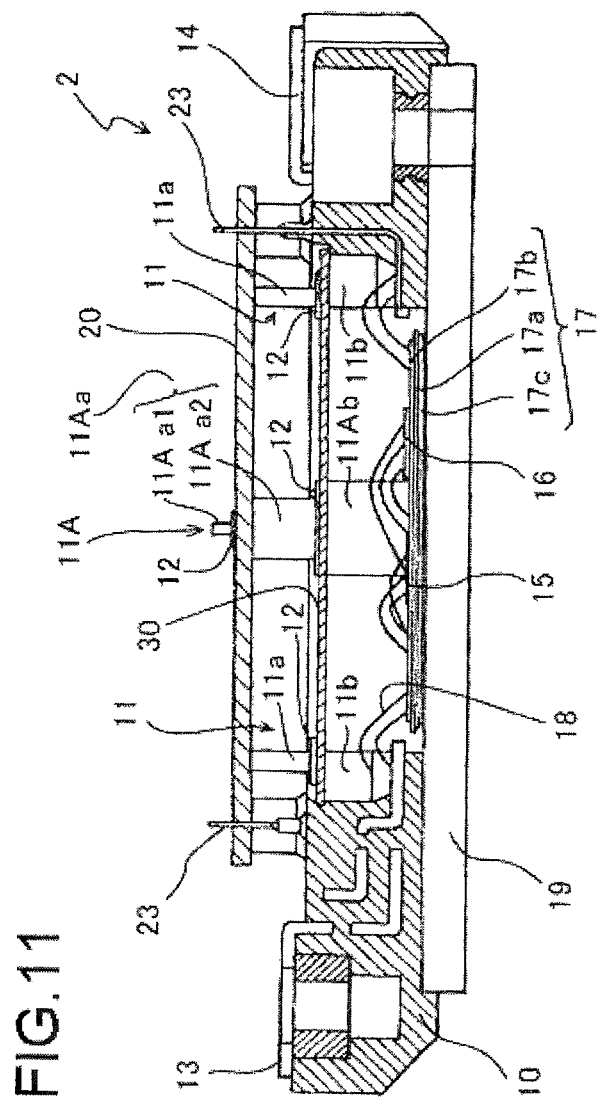
FIG. 11 is a cross-sectional view illustrating another embodiment of the present invention.

FIG. 11 illustrates a cross-sectional view of another embodiment of the present invention. In FIG. 11, the same members as those illustrated in FIG. 4 will be denoted by the same reference numerals, and redundant description thereof will not be provided.

A semiconductor device 2 of the embodiment illustrated in FIG. 11 is an example in which a convex portion 11A*a* of a support 11A has a portion 11A*a*1 that protrudes through the through-hole 31 formed in the control circuit board 20. The protruding portion 11A*a*1 has a smaller diameter than a base portion 11A*a*2 of the convex portion on the lower side than the control circuit board 20, and the control circuit board 20 is placed on a flat portion formed in a connection portion between the protruding portion 11A*a*1 and the base portion 11A*a*2. This control circuit board 20 is fixed by the annular fastener 12. Moreover, the shield plate 30 is fixed by the annular fastener 12 having an inner diameter corresponding to the diameter of the base portion 11A*a*2 of the convex portion of the support 11A. According to the present embodiment illustrated in FIG. 11, the control circuit board 20 as well as the shield plate 30 can be fixed by the support 11A and the annular fastener 12 together with other screwing or in replacement of screwing. Thus, it is possible to further suppress vibration of the control circuit board 20 and to improve workability in fixing the control circuit board 20.

In the semiconductor device 2 of the present embodiment illustrated in FIG. 11, the shield plate 30 is fixed to the support 11 by the annular fastener 12 as fixing means. However, shield plates 30A, 40, 50, 60, and 70 of the second to seventh embodiments described later may be used instead of the shield plate 30 illustrated in FIG. 11, and the shield plates may be fixed to the support 11 by the claw 31*a* formed in the through-hole 31 of the shield plates.

(Third Embodiment)

Next, a semiconductor device according to a third embodiment of the present invention will be described.

Figure 12:
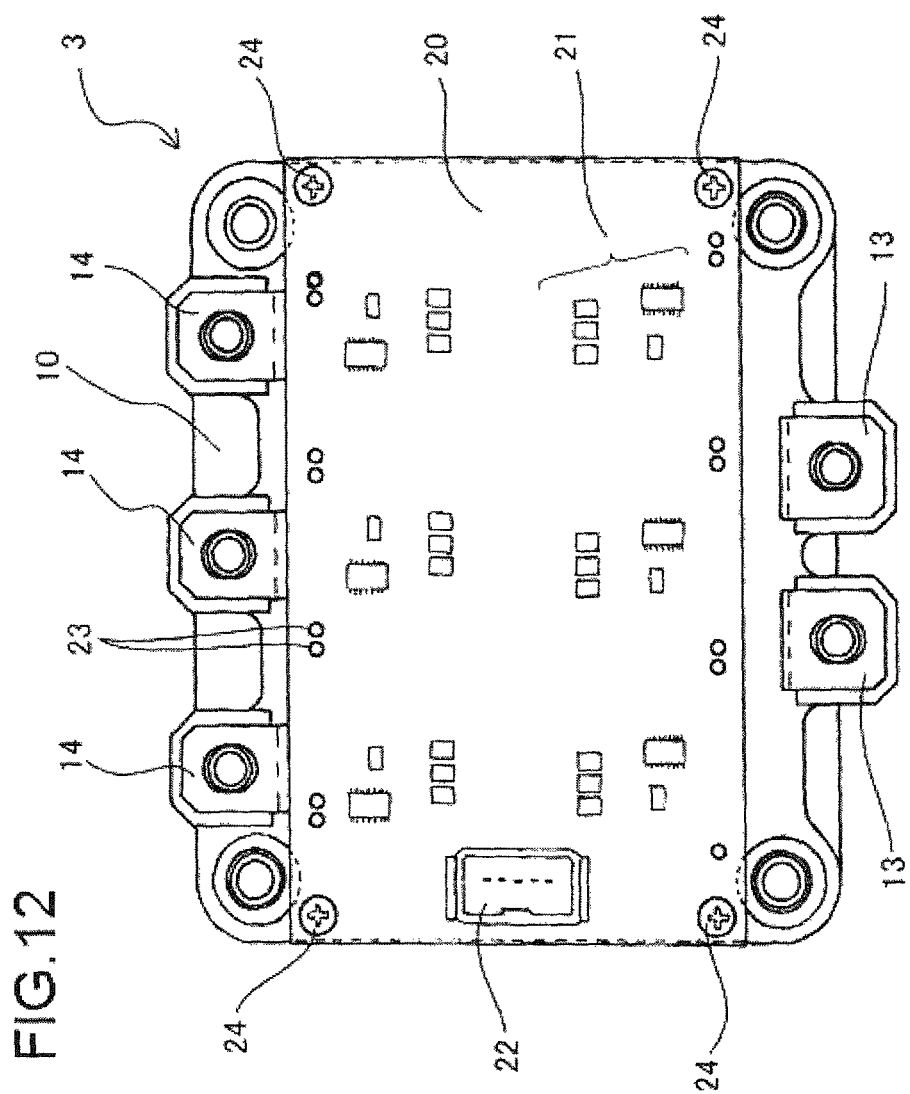
FIG. 12 is a plan view of a semiconductor device according to a third embodiment of the present invention.
Figure 13:
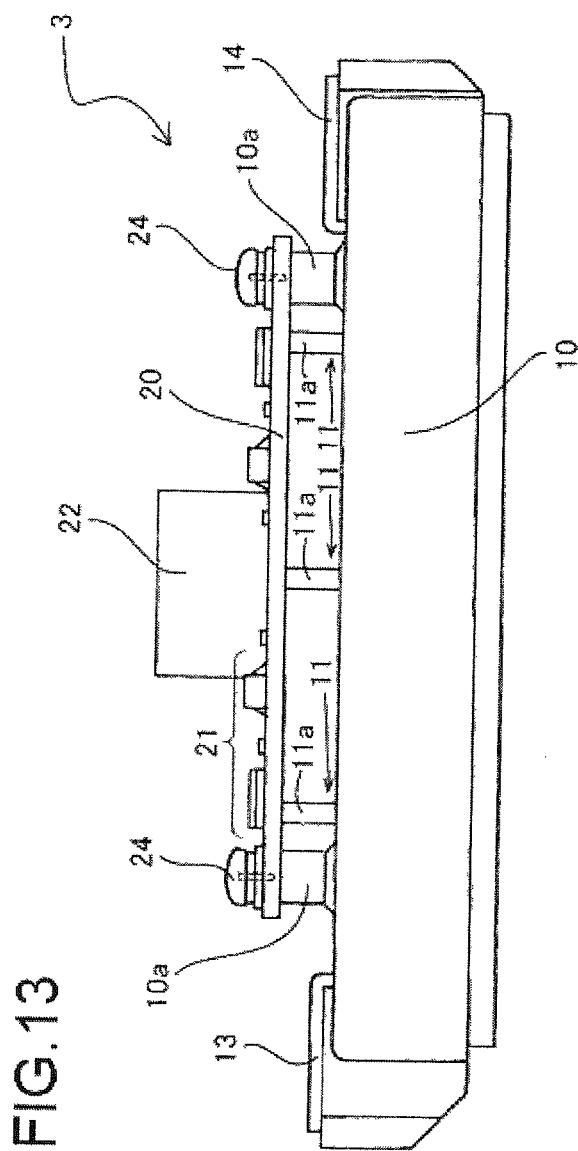
FIG. 13 is a side view of a semiconductor device illustrated in FIG. 12.

A semiconductor device 3 of the present embodiment is illustrated by a plan view in FIG. 12 and a side view in FIG. 13. In FIGS. 12 and 13, the same components as the components of the semiconductor device of the first embodiment illustrated by the plan view in FIG. 1 and the side view in FIG. 2 are denoted by the same reference numerals. The semiconductor device 3 of the present embodiment illustrated in FIGS. 12 and 13 has the same appearance as the semiconductor device of the first embodiment illustrated in FIGS. 1 and 2. Thus, in the description with reference to FIGS. 12 and 13, redundant description of the same portions of the semiconductor device 3 of the present embodiment as those of the semiconductor device 1 of the first embodiment described with reference to FIGS. 1 and 2 will not be provided.

Figure 14:
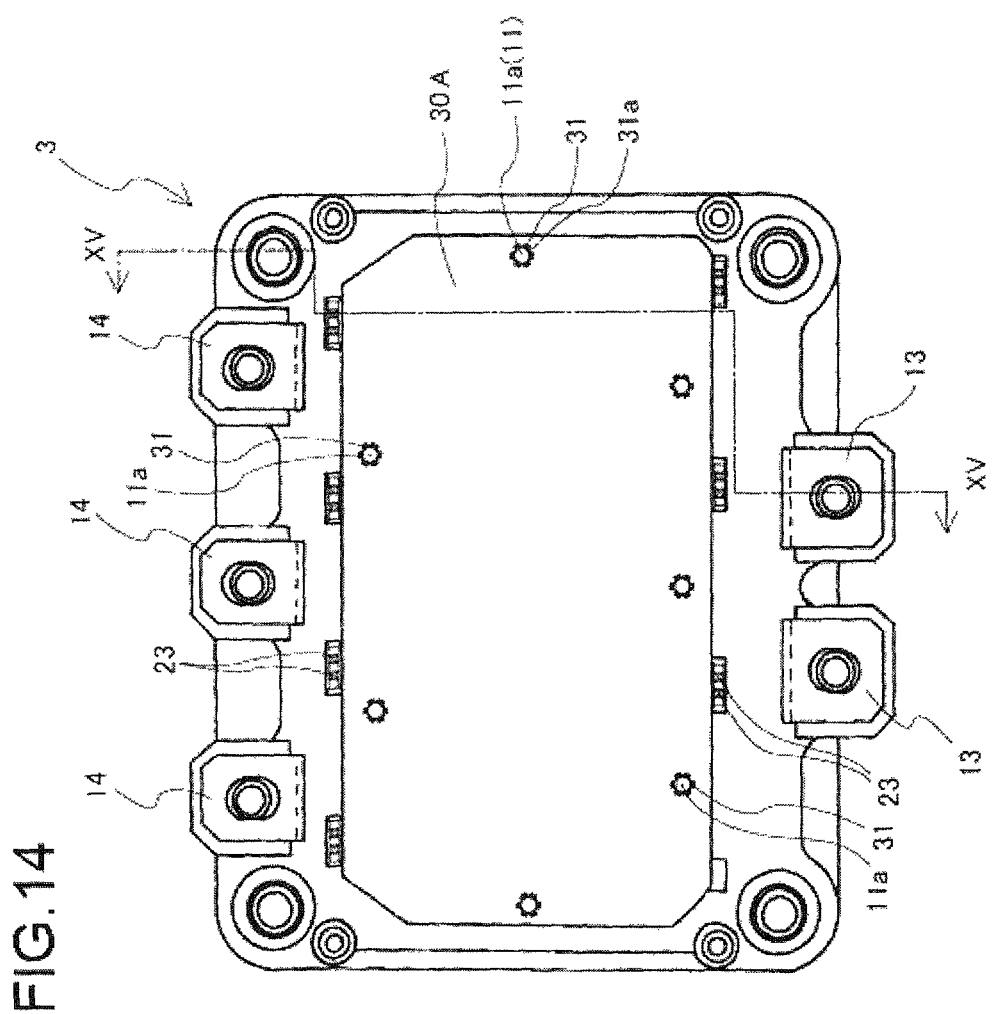
FIG. 14 is a plan view illustrating a state where a control circuit board illustrated in FIG. 12 is removed.

FIG. 14 illustrates a plan view illustrating a state where the control circuit board 20 illustrated in FIG. 12 is removed. The semiconductor device 3 includes a shield plate 30A which is provided on the upper end of the outer case 10 or in a lower portion than the upper end. That is, the shield plate 30A is accommodated in the outer case 10. A plurality of through-holes 31 through which the convex portions 11*a* of the supports 11 pass is formed in the periphery of the shield plate 30A. The convex portions 11*a* of the supports 11 pass through the through-holes 31. A claw 31*a* that engages with the convex portion 11*a* is formed in the through-hole 31 as fixing means, which will be described in detail later.

Figure 15:
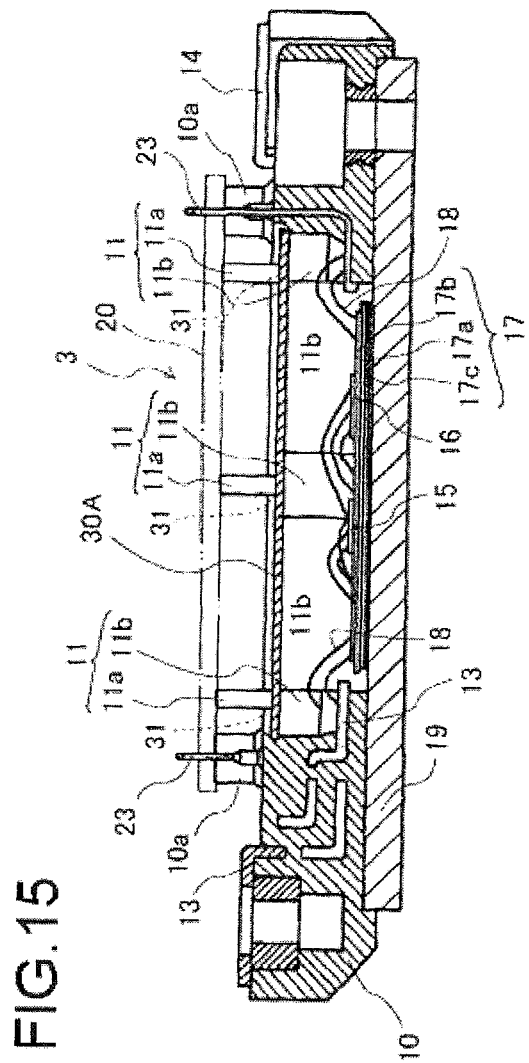
FIG. 15 is a cross-sectional view along the line XV-XV in FIG. 14.

FIG. 15 illustrates a cross-sectional view along the line XV-XV in FIG. 14. As compared to the cross-sectional view of the semiconductor device 1 of the first embodiment illustrated in FIG. 4, the semiconductor device 3 of the present embodiment illustrated in FIG. 15 is different from the semiconductor device 1 of the first embodiment in that the claw 31*a* (see FIG. 18) formed in the through-hole 31 of the shield plate 30A engages with the convex portion 11*a* of the support 11, whereby the shield plate 30A is fixed to the support 11. Except for this difference, the semiconductor device 3 of the present embodiment illustrated in FIG. 15 has the same configuration as the semiconductor device 1 illustrated in FIG. 4, and the same components as those of the semiconductor device 1 illustrated in FIG. 4 are denoted by the same reference numerals. Thus, redundant description of the same portions of the semiconductor device 3 of the present embodiment illustrated in FIG. 15 as those described with reference to FIG. 4 will not be provided.

Moreover, the support 11 provided in the outer case 10 of the semiconductor device 3 of the present embodiment is the same as the support 11 provided in the outer case 10 of the semiconductor device 1 of the first embodiment illustrated in FIG. 5. Thus, redundant description of the same portion of the support of the semiconductor device 3 of the present embodiment as that described with reference to FIG. 5 and other figures will not be provided.

Figure 16:
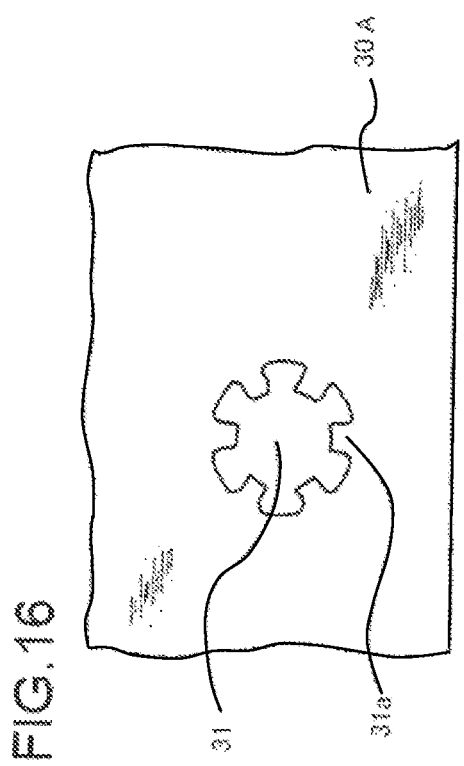
FIG. 16 is an enlarged view of a portion of a shield plate.

As illustrated in FIG. 16 by a partial enlarged view of the shield plate 30A of the present embodiment, a plurality of claws 31*a* extending toward the center from the peripheral surface of the through-hole 31 is formed in the through-hole 31 of the shield plate 30A as fixing means for fixing the shield plate 30A to the support 11. The claws 31*a* can be formed by performing drilling such as punching when forming the through-holes 31 in the shield plate 30A made from an electromagnetic shielding material such as aluminum, copper, or iron so that the holes have a shape illustrated in FIG. 16. The diameter of an imaginary circle contacting the distal ends of the claws 31a may be slightly smaller than the diameter in the base of the convex portion 11a connected to the flat portion 11c of the support 11. Due to this, when the convex portion 11a of the support 11 passes through the through-hole 31 of the shield plate 30A, the claws 31a of the through-hole 31 engage with the convex portion 11a in such a way that the claws 31a bite into the convex portion 11a or are deformed. Thus, it is possible to fix the shield plate 30A to the support 11 by the claws 31a.

The claw 31a may have a trapezoidal shape that protrudes toward the center when seen in the plan view as illustrated in FIG. 16 and may have a triangular shape, a quadrangular shape, or a circular arc shape that protrudes toward the center, for example. Instead of the claws 31a, the fixing means may be configured such that the through-hole 31 may have a polygonal shape in a plan view, the diameter of an inscribed circle of the polygon may be slightly smaller than the diameter in the base of the convex portion 11a, and the inner surface of the polygonal through-hole 31 bites into the convex portion 11a.

As another example of the fixing means for fixing the shield plate 30A to the support 11, the annular fastener 12 (see FIG. 6) which is prepared separately from the shield plate 30A and has claws engaging with the convex portion 11a that protrudes through the through-hole 31 of the shield plate 30A may be used additionally.

Figure 17:
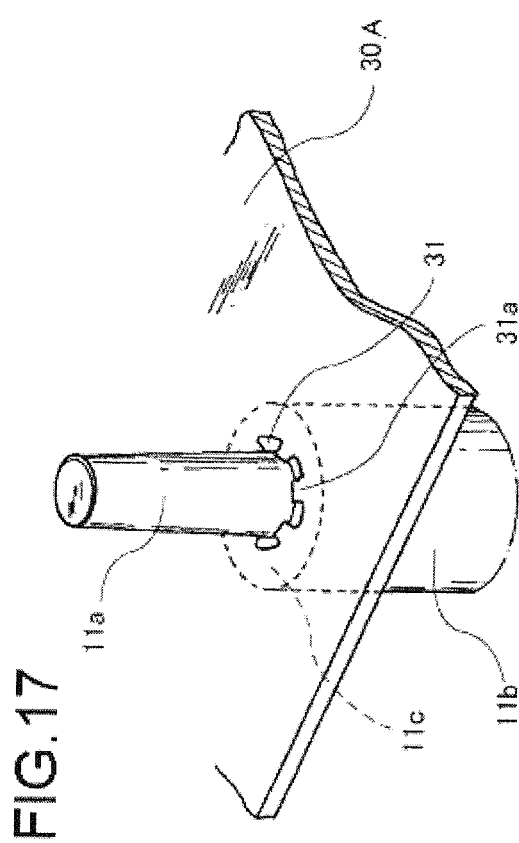
FIG. 17 is a perspective view illustrating a state where a shield plate is attached to a support.

FIG. 17 illustrates a schematic perspective view illustrating a state where the shield plate 30A is fixed to the support 11 by the claws 31a of the through-hole 31. When the shield plate 30A is lowered in relation to the support 11 until the through-hole 31 of the shield plate 30A is aligned with the convex portion 11a of the support 11, the convex portion 11a passes through the through-hole 31, and the shield plate 30A contacts the flat portion 11c of the support, the claws 31a of the through-hole 31 bite into the convex portion 11a. In this way, the claws 31a engage with the convex portion 11a, and the shield plate 30A is fixed to the support 11.

In the semiconductor device 3 of the present embodiment, since the shield plate 30A is fixed by the convex portion 11a of the support 11 and the claws 31a of the shield plate 30A, it is not necessary to screw the shield plate 30A. Thus, the semiconductor device 3 can save the height of screws, and it is not necessary to create insulation distance for metal screws. Therefore, it is possible to reduce the thickness and the size of the semiconductor device 3 as compared to when the shield plate 30A is screwed. Specifically, the thickness of the semiconductor device 3 of the present embodiment can be reduced at least by 5 mm as compared to the conventional semiconductor device in which the shield plate 30A is screwed.

In the semiconductor device 3 of the present embodiment, since the shield plate 30A can be fixed just by attaching the shield plate 30A having the through-hole 31 in which the claws 31a are formed to the convex portion 11a of the support 11, assembling workability is improved as compared to the screwing method. Moreover, since it is easy to create the hole shape of the through-hole 31 of the shield plate 30A, it is possible to reduce the component cost. Further, since the improvement of the outer case 10 is achieved by a simple structure of providing the support 11, it is possible to reduce the number of components and the cost as compared to the screwing method. Furthermore, although the method of screwing the shield plate 30A to the outer case 10 involves forming female screw holes in the screw seats formed in the outer case 10, a sealing material that seals semiconductor elements in the outer case may enter into the holes of the screw seats. Due to this, the screw seats are formed at a higher position such that the sealing material does not enter into the screw seats. In this respect, it is difficult to reduce the height of the shield plate and the height of the outer case. In contrast, in the semiconductor device 3 of the present embodiment, the support 11 formed on the outer case 10 does not have a hole, and it is not necessary to take entrance of the sealing material into consideration. Thus, it is possible to provide the shield plate 30A in the outer case 10 and to reduce the height of the outer case.

Further, in the semiconductor device 3 of the present embodiment, the distal end of the convex portion 11a of the support 11 is configured to contact the control circuit board 20. As a result, it is possible to suppress vibration of the control circuit board 20. In particular, the vibration suppressing efficiency of the support 11 is large when the control circuit board 20 has a large size.

Figure 18:
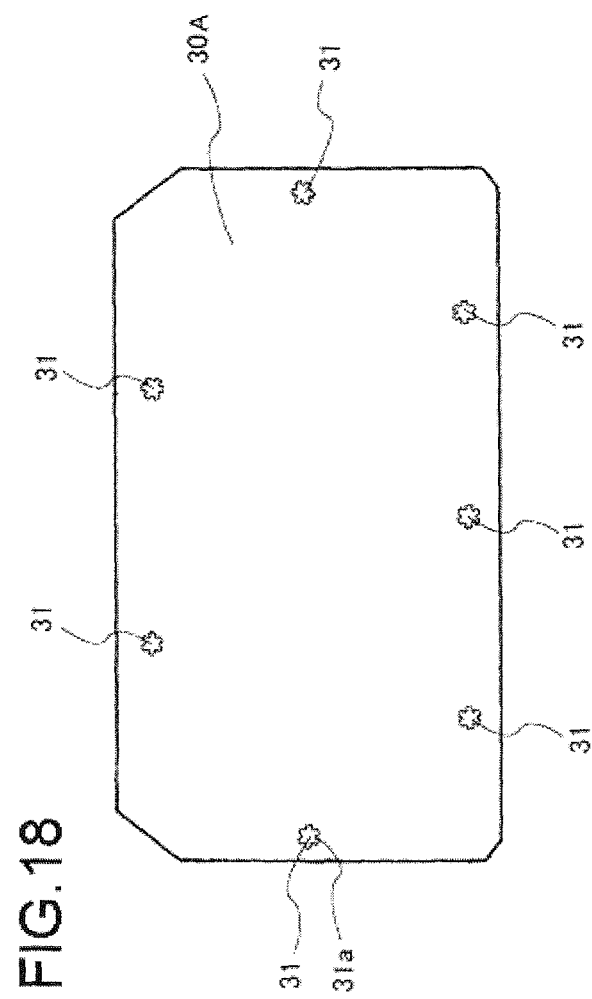
FIG. 18 is a plan view of a shield plate of the semiconductor device according to the third embodiment of the present invention.

FIG. 18 illustrates a plan view of an example of the shield plate 30A. The shield plate 30A illustrated has an approximately rectangular shape in a plan view, in which two or three through-holes 31 are formed on the long side and one through-hole 31 is formed on the short side. The shield plate 30A is formed of a plate made from a material such as aluminum, copper, or iron. In order to provide electric insulation, the shield plate 30A is preferably insert-molded or coated with an insulating resin. Polyphenylene sulfide (PPS) or polybutylene terephthalate (PBT) is used as the resin. Moreover, an insulating sheet may be attached to the shield plate 30A instead of the resin. Further, an electromagnetic wave absorbing sheet may be attached to at least one surface of the shield plate 30A instead of the resin.

When it is desirable to electrically connect the shield plate 30A to the ground line of the control circuit board 20 as anti-noise countermeasures, at least one of the plurality of supports 11 may be made from metal so that the shield plate 30A and the control circuit board 20 are electrically connected.

(Fourth Embodiment)

Next, a fourth embodiment of the semiconductor device of the present invention will be described.

The semiconductor device of the fourth embodiment has the same configuration as the semiconductor device 3 of the third embodiment except for a shield plate 40 described below. That is, the semiconductor device of the fourth embodiment uses the shield plate 40 instead of the shield plate 30A of the semiconductor device 3 of the third embodiment. The semiconductor device of the fourth embodiment includes the outer case 10 in which the support 11 is provided and the control circuit board 20 similarly to the semiconductor device 3 of the third embodiment, and the shield plate 40 having the same shielding property as the shield plate 30A of the semiconductor device 3 of the third embodiment is fixed to the support 11. Thus, in the following description, the shield plate 40 which is the difference from the semiconductor device 3 of the third embodiment will be described.

Figure 19:
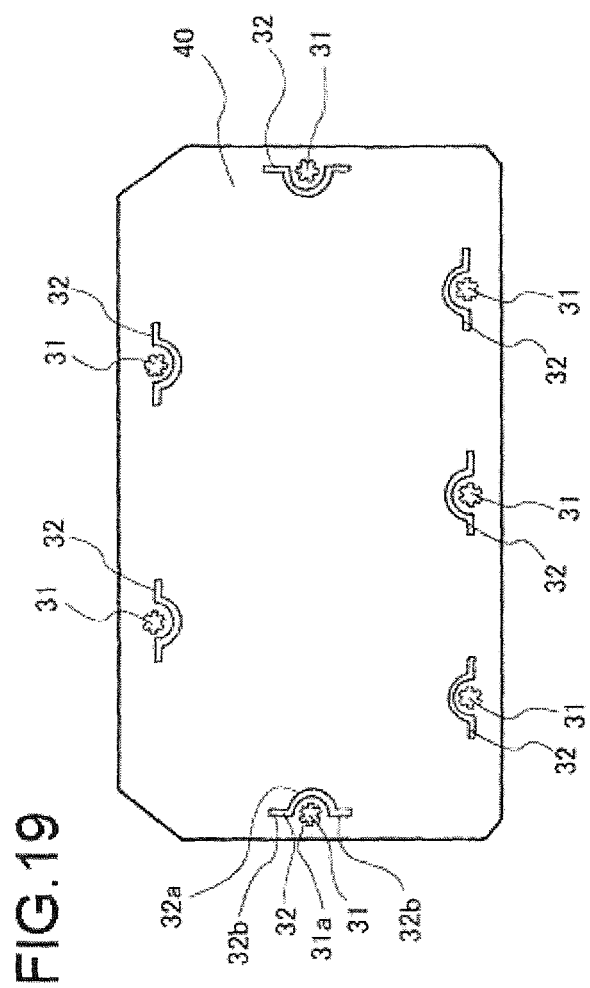
FIG. 19 is a plan view of a shield plate of a semiconductor device according to a fourth embodiment of the present invention.

FIG. 19 illustrates a plan view of the shield plate 40 of the semiconductor device according to the present embodiment. The shield plate 40 illustrated in FIG. 19 has an approximately rectangular shape in a plan view, and includes the through-hole 31 through which the convex portion 11a of the support 11 formed in the outer case 10 passes similarly to the shield plate 30A of the third embodiment illustrated in FIG. 18. A plurality of claws 31a extending toward the center from the peripheral surface of the through-hole 31 is formed in the through-hole 31 similarly to the through-hole 31 illustrated in FIG. 16. Moreover, a slit 32 is formed around the through-hole 31 of the shield plate 40. The slit 32 is the difference from the shield plate 30A of the third embodiment.

The slit 32 illustrated in FIG. 19 is a groove that penetrates from one surface of the shield plate 40 to the other surface. The slit 32 has such a plan-view shape that includes a central portion 32a formed at a position closer to the center of the shield plate 40 than the through-hole 31 and having a circular arc-shape of which the center is located substantially at the same position as the through-hole 31 and an end portion 32b connected to the ends of the central portion 32a so as to extend in parallel to an adjacent edge of the shield plate 40.

The slit 32 facilitates an operation of inserting the convex portion 11a of the support 11 into the through-hole 31 when the shield plate 40 is attached to the outer case 10 during assembling of the semiconductor device. When the convex portion 11a of the support 11 is inserted into the through-hole 31, it is necessary to align the convex portion 11a of the support 11 with the through-hole 31 of the shield plate 40. However, it is difficult to align all convex portions 11a with all through-holes 31. In particular, a structure in which the claws 31a are formed in the through-hole 31 and engage with the convex portion 11a requires high alignment accuracy. As an example of the operation of aligning the through-holes 31 with the convex portions 11a, the convex portions 11a of the supports 11 corresponding to the through-holes 31 arranged along one side of the respective sides of the approximately rectangular shield plate 40 may be inserted into the through-holes 31, and then, the convex portions 11a of the supports 11 may be inserted into the through-holes 31 arranged along the other side. In this case, when the shield plate 40 is inclined with respect to the upper surface of the outer case 10, the position of the through-holes 31 arranged along the other side is shifted from the position of the convex portions 11a of the supports 11 corresponding to the through-holes. Even if the shift amount is small, aligning the position may become difficult. In particular, when the size of the outer case 10 and the shield plate 40 is large, the shift amount is large and aligning the position becomes difficult.

Since the shield plate 40 has the slits 32 formed near the through-holes 31 at positions closer to the center of the shield plate than the through-holes 31, the portions near the through-holes 31 of the shield plate 40 are likely to be elastically deformed when force is applied. Specifically, when force is applied toward the center from one side of the shield plate 40, the portions are elastically deformed so that the width of the slit 32 formed at the position closer to the center than the through-hole 31 decreases. With this elastic deformation, the positions of the through-holes 31 are moved toward the center. Thus, during assembling of a semiconductor device where the shield plate 40 is attached to the outer case 10, even when the through-holes 31 are misaligned with the convex portions 11a of the supports 11, it is possible to move the positions of the through-holes 31 with elastic deformation and to align by applying force to the shield plate 40. Therefore, the operation of inserting the convex portions 11a of the supports 11 into the through-holes 31 is facilitated.

Since the slits 32 are formed at the positions near the through-holes 31, the portions near the through-holes 31 of the shield plate 40 can be moved with elastic deformation. More preferably, as illustrated in FIG. 19, the slits 32 may be formed near the through-holes 31 at positions closer to the center of the shield plate 40 than the through-holes 31. By doing so, as the alignment operation, as described above, even when the convex portions 11a of the supports 11 corresponding to the through-holes 31 arranged along one side of the respective sides of the approximately rectangular shield plate 40 are inserted into the through-holes 31, and then, the convex portions 11a of the supports 11 are inserted into the through-holes 31 arranged along the other side, it is possible to easily align the through-holes 31 with the convex portions 11a.

The slits 32 are not limited to the example in which the slits 32 are formed near all through-holes 31 formed in the shield plate 40, but the slits 32 may be formed near some of the through-holes 31. However, it is preferable that the slits 32 are formed near all through-holes 31.

In the example illustrated in FIG. 19, the slit 32 includes the circular arc-shaped central portion 32a and the linear end portion 32b. This is because, although the present embodiment includes a mode in which the slit 32 is formed only of the central portion 32a, a crack may appear toward the end of the shield plate 40 from the ends of the central portion 32a in the slit formed only of the central portion 32a, and in addition, the movable range when force is applied to the shield plate 40 is small, and the elastic deformation amount is small. Although the movable range can be increased by increasing the size of the circular arc-shaped central portion 32a, if the size of the central portion 32a is increased such that the central portion 32a is positioned immediately above the semiconductor element (semiconductor chip) accommodated in the outer case 10, the shielding property of the shield plate 40 may decrease. When a shape in which the linear end portions 32b are formed so as to be connected to the ends of the central portion 32a as illustrated in FIG. 19 is employed, it is possible to prevent cracks, to increase the movable range, and to increase the elastic deformation amount.

The central portion 32a of the slit 32 is not limited to a circular arc-shape illustrated in FIG. 19, and two sides of a triangle or three sides of a quadrangle may form the central portion 32a.

(Fifth Embodiment)

Next, a fifth embodiment of the semiconductor device according to the present invention will be described.

Figure 20:
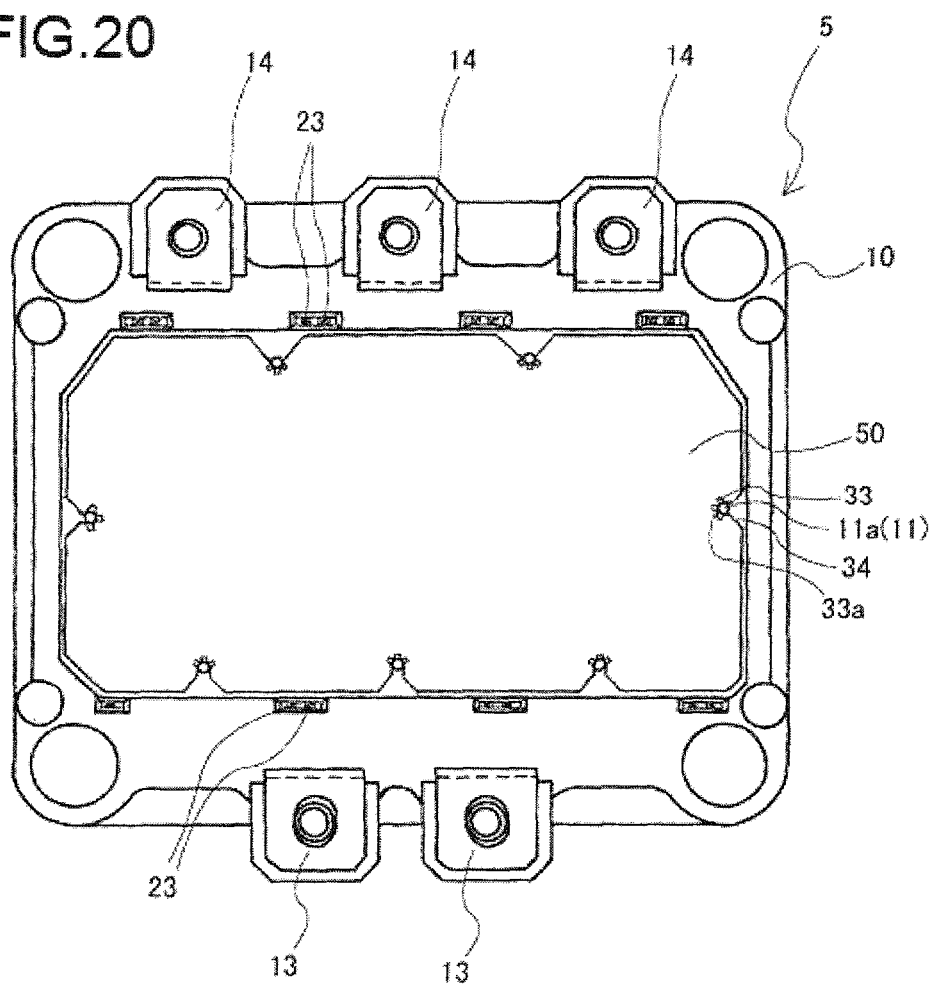
FIG. 20 is a plan view of a semiconductor device according to a fifth embodiment of the present invention.

FIG. 20 illustrates a plan view of a semiconductor device 5 of the present embodiment in which an insulating circuit board is removed. The semiconductor device 5 illustrated has the same configuration as the semiconductor device 3 of the third embodiment except for a shield plate 50 described below. That is, the semiconductor device of the fifth embodiment uses the shield plate 50 instead of the shield plate 30A of the semiconductor device 3 of the third embodiment. The semiconductor device of the fifth embodiment includes the outer case 10 in which the support 11 is formed and the control circuit board 20 (not illustrated) similarly to the semiconductor device of the third embodiment, in which the shield plate 50 having the same shielding property as the shield plate 30A of the semiconductor device 3 of the third embodiment is fixed to the support 11. Thus, redundant description of the outer case 10 and the power semiconductor elements (chips) 15 and 16 (not illustrated) and the control circuit board 20 accommodated in the outer case 10 will not be provided.

Figure 21:
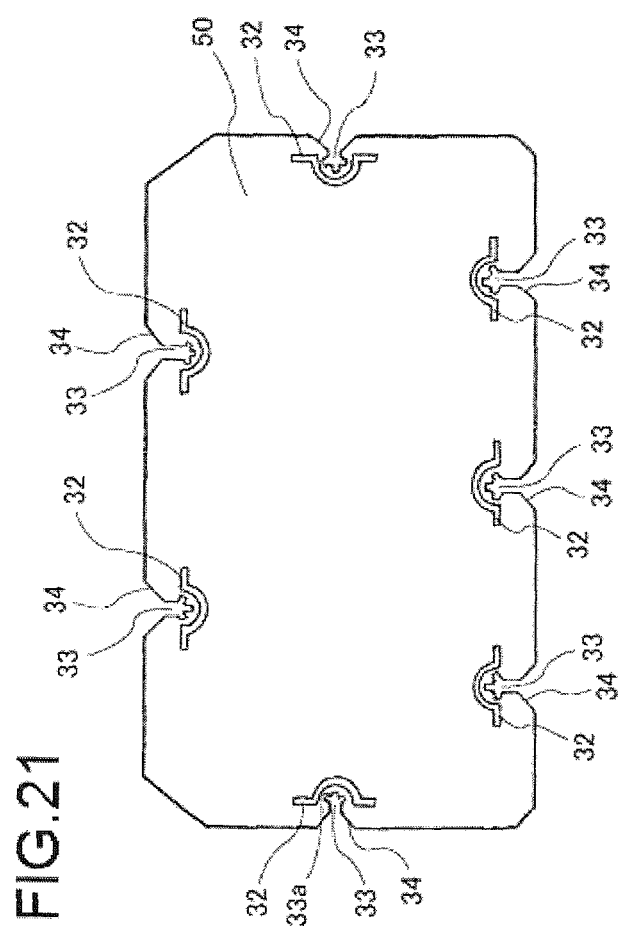
FIG. 21 is a plan view of a shield plate of the semiconductor device according to the fifth embodiment of the present invention.

FIG. 21 illustrates a plan view of the shield plate 50 of the semiconductor device 5 according to the present embodiment. The shield plate 50 illustrated in FIG. 21 has an approximately rectangular shape in a plan view, in which the through-hole 33 through which the convex portion 11a of the support 11 formed in the outer case 10 passes is formed. A notch 34 cut from the edge of the shield plate 50 is connected to the through-hole 33.

Claws 33a that extend toward the center from the peripheral surface of the through-hole 33 are formed in the half of the circumference of the through-hole 33 as fixing means. The claws 33a engage with the convex portion 11a of the support 11, whereby the shield plate 50 is fixed to the support 11.

The notch 34 formed between the through-hole 33 of the shield plate 50 and the edge of the shield plate 50 illustrated in FIG. 21 facilitates the operation of inserting the convex portion 11a of the support 11 into the through-hole 33 when the shield plate 50 is attached to the outer case 10 during assembling of the semiconductor device. As an example of the operation of aligning the through-holes 33 with the convex portions 11a, the convex portions 11a of the supports 11 corresponding to the through-holes 33 arranged along one side of the respective sides of the approximately rectangular shield plate 50 may be inserted into the through-holes 33, and then, the convex portions 11a of the supports 11 may be inserted into the through-holes 33 arranged along the other side. In this case, even when the shield plate 40 is inclined with respect to the upper surface of the outer case 10 and the position of the through-holes 33 arranged along the other side is shifted from the position of the convex portions 11a of the supports 11 corresponding to the through-holes, the positions of the convex portions 11a of the supports 11 are included in the notches 34. Thus, the convex portions 11a of the supports 11 can be easily aligned with the positions of the through-holes 33 by being guided along the notches 34, and the operation of inserting the convex portions 11a of the supports 11 into the through-holes 33 is facilitated.

In the example illustrated in FIG. 21, in order to facilitate the alignment between the through-holes 33 and the convex portions 11a of the supports 11, the notch 34 has such a shape that the width increases gradually as the notch advances from the through-hole 33 toward the end of the shield plate 40. However, the plan-view shape of the notch 34 is not limited to the shape illustrated in FIG. 21 as long as the notch 34 can guide the convex portion 11a.

The shield plate 50 illustrated in FIG. 21 has the slits 32 formed near the through-holes 33 at positions closer to the center of the shield plate 50 than the through-holes 33. The slit 32 illustrated in FIG. 21 has the same configuration as the slit 32 of the shield plate 40 described with reference to FIG. 19 in the fourth embodiment and provides the same advantageous effects. Thus, redundant description of the slit 32 described in the fourth embodiment will not be provided.

Since the shield plate 50 of the present embodiment includes the notches 34 connected to the through-holes 33 and the slits 32, by the synergy of the notches 34 and the slits 32, the operation of inserting the convex portions 11a of the supports 11 into the through-holes 33 when attaching the shield plate 50 to the outer case 10 during assembling of the semiconductor device is facilitated.

(Sixth Embodiment)

Next, a sixth embodiment of the semiconductor device according to the present invention will be described.

Figure 22:
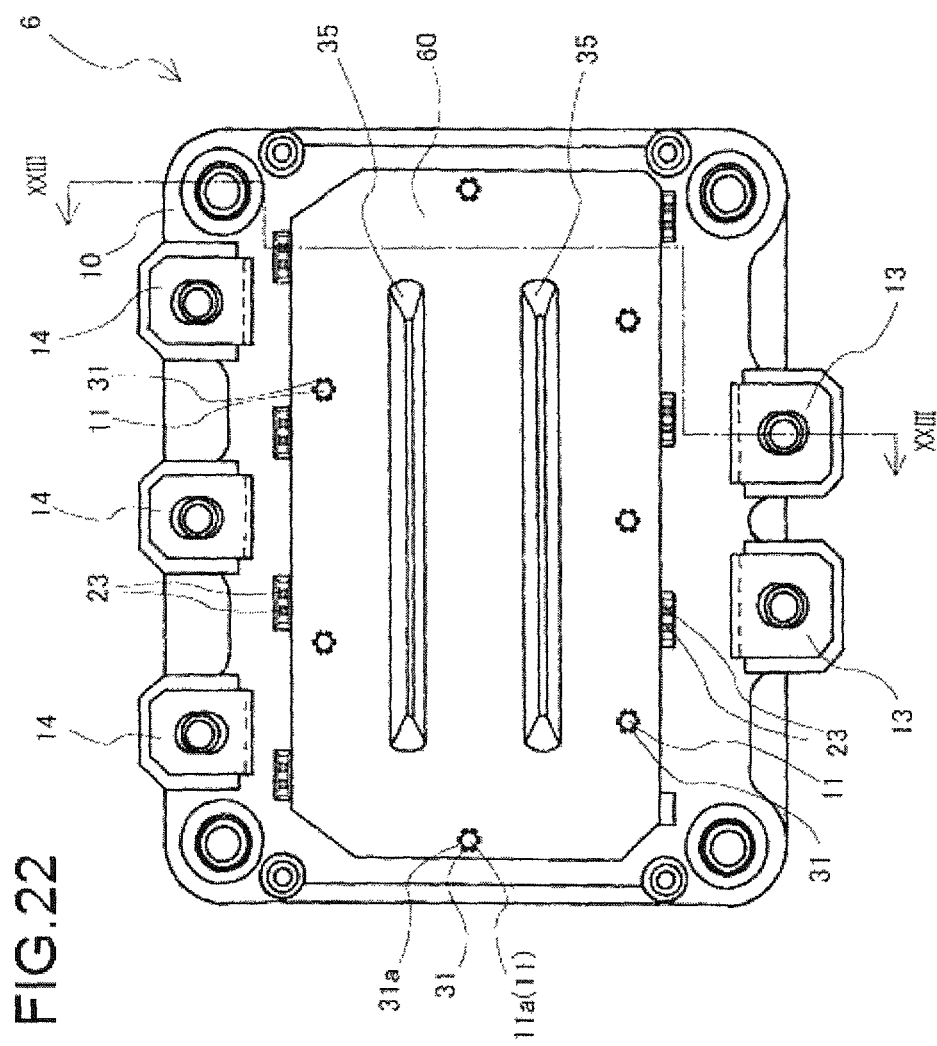
FIG. 22 is a plan view of a semiconductor device according to a sixth embodiment of the present invention.
Figure 23:
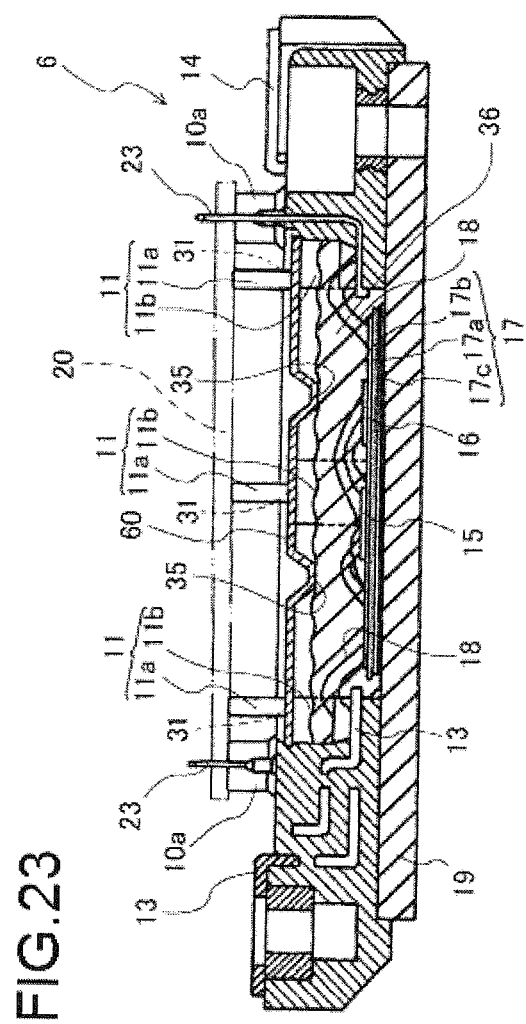
FIG. 23 is a cross-sectional view along the line XXIII-XXIII in FIG. 22.

FIG. 22 illustrates a plan view of a semiconductor device 6 of the present embodiment and FIG. 23 illustrates a cross-sectional view along the line XXIII-XXIII of the semiconductor device 6 illustrated in FIG. 22. FIGS. 22 and 23 illustrate the semiconductor device 6 in the state where the control circuit board 20 is removed. FIGS. 22 and 23 are diagrams corresponding to FIGS. 14 and 15 of the third embodiment described above, and the same components as those of FIGS. 14 and 15 are denoted by the same reference numerals. Thus, in the following description, description of the same components of the semiconductor device 6 of the sixth embodiment as those described in the third embodiment will not be provided.

The semiconductor device 6 of the present embodiment illustrated in FIGS. 22 and 23 has the same configuration as the semiconductor device 3 of the third embodiment illustrated in FIGS. 14 and 15 except for a shield plate 60 described below. That is, the semiconductor device 6 of the sixth embodiment uses the shield plate 60 instead of the shield plate 30A of the semiconductor device 3 of the third embodiment. The semiconductor device 6 of the sixth embodiment includes the outer case 10 in which the support 11 is provided and the control circuit board 20 similarly to the semiconductor device 3 of the third embodiment, and the shield plate 60 having the same shielding property as the shield plate 30A of the semiconductor device 3 of the third embodiment is fixed to the support 11.

FIGS. 24A and 24B illustrate a plan view (FIG. 24A) and a cross-sectional view (FIG. 24B) of the shield plate 60 of the semiconductor device 6 of the present embodiment. The shield plate 60 illustrated in FIGS. 24A and 24B has an approximately rectangular shape in a plan view, and includes the through-hole 31 through which the convex portion 11a of the support 11 formed in the outer case 10 passes similarly to the shield plate 30A of the third embodiment illustrated in FIG. 18. A plurality of claws 31a extending toward the center from the peripheral surface of the through-hole 31 is formed in the through-hole 31 similarly to the through-hole 31 illustrated in FIG. 16. Moreover, a convex portion 35 is formed on a surface of the shield plate 60 on the side (see FIG. 23) closer to the semiconductor elements (chips) 15 and 16 when the shield plate 60 is attached to the outer case 10. The convex portion 35 is the difference from the shield plate 30A of the third embodiment.

The convex portions 35 illustrated in FIG. 24 are two linear portions (protruding strips or projections) extending in parallel along the longitudinal direction of the shield plate 60. The convex portions 35 can be formed by press-processing the shield plate 60, for example.

The convex portion 35 has a structure in which a distal end is contacting a sealing material 36 filled in the outer case 10. Alternatively, the convex portion 35 may have a structure in which the distal end is contacting a member provided in the outer case. When the distal end of the convex portion 35 is contacting the sealing material 36 filled in the outer case 10 or the member provided in the outer case, it is possible to press the sealing material 36 or the member, to suppress vibration of the sealing material 36 or the member provided in the outer case, and to suppress thermal deformation. Moreover, since a main material of the shield plate 60 is metal such as aluminum having good heat conductivity, heat emitted from the semiconductor elements (chips) 15 and 16 in the outer case 10 is radiated.

The sealing material 36 filled in the outer case 10 is a silicone gel or a silicone, urethane, or epoxy resin used as a seal material in a general semiconductor module.

Figure 25:
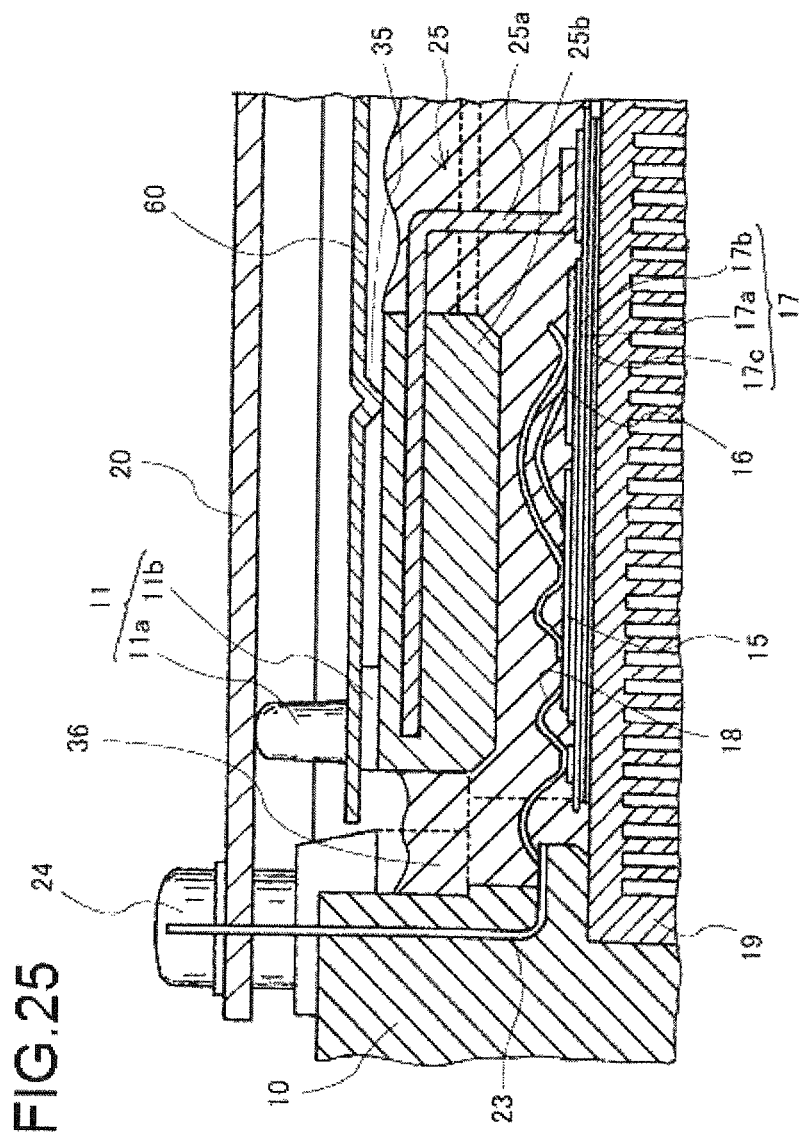
FIG. 25 is a cross-sectional view of a semiconductor device having a busbar.

An example of the member contacting the distal end of the convex portion 35 is a busbar block provided in the outer case 10. FIG. 25 illustrates a cross-sectional view of a semiconductor device having a busbar block 25. In FIG. 25, the same components as those illustrated in FIG. 23 are denoted by the same reference numerals. The busbar block 25 has a structure (block structure) in which a portion of a busbar 25a connected to the conductor layer 17b or the like of the insulating substrate 17 is wrapped by a block 25b, and the busbar block 25 is provided above the semiconductor elements (chips) 15 and 16. The busbar 25a is formed of a plate member made from copper, aluminum, or the like, and the block 25b is formed from an insulating material such as resin or ceramics. In the semiconductor device illustrated in FIG. 25, the convex portion 35 of the shield plate 60 is connected to the busbar block 25.

In order to press the busbar block 25 provided in the outer case 10 with the convex portions 35 of the shield plate 60, it is preferable to tightly fix the shield plate 60 to the convex portions 11a of the supports 11.

Although the semiconductor device 6 of the present embodiment uses the claws 31a of the through-holes 31 as fixing means of the shield plate 60 having the convex portions 35, the fixing means is not limited to the claws 31a of the through-holes 31. As the fixing means, the annular fastener 12 illustrated in FIG. 6 may be used instead of the claws 31a of the through-holes 31 or together with the claws 31a of the through-holes 31. That is, the shield plate having the convex portions 35 is not limited to the shield plate 60 illustrated in FIGS. 24A and 24B. For example, a shield plate in which the convex portions 35 of the shield plate 60 illustrated in FIGS. 24A and 24B is formed on the shield plate 30 of the semiconductor device 1 of the first embodiment illustrated in FIG. 3 may be used.

Moreover, the claws 31a of the through-holes 31 which is the fixing means for fixing the shield plate 60 to the supports 11 are not always necessarily provided in all through-holes 31 that are formed in the shield plate 60. In order to tightly fix the shield plate 60 to the convex portions 11a of the supports 11, the claws 31a may be provided in some of the through-holes 31 formed in the shield plate 60, and screws for fixing the supports 11 may be provided in the remaining through-holes so that the shield plate 60 is partially screwed.

(Seventh Embodiment)

Next, a seventh embodiment of the semiconductor device according to the present invention will be described.

The semiconductor device of the seventh embodiment has the same configuration as the semiconductor device 6 of the sixth embodiment except for a shield plate 70 described below. That is, the semiconductor device of the seventh embodiment uses the shield plate 70 instead of the shield plate 60 of the sixth embodiment. The semiconductor device of the seventh embodiment includes the outer case 10 in which the support 11 is provided and the control circuit board 20 (not illustrated) similarly to the semiconductor device 6 of the sixth embodiment, and the shield plate 70 having the same shielding property as the shield plate 60 of the semiconductor device of the sixth embodiment is fixed to the support 11. Thus, in the following description, the shield plate 70 which is the difference from the semiconductor device 6 of the sixth embodiment will be described.

FIGS. 26A and 26B illustrate a plan view (FIG. 26A) and a cross-sectional view (FIG. 26B) of the shield plate 70. The shield plate 70 illustrated in FIGS. 26A and 26B has an approximately rectangular shape in a plan view, and includes the through-hole 31 through which the convex portion 11a of the support 11 formed in the outer case 10 passes similarly to the shield plate 60 of the sixth embodiment illustrated in FIGS. 24A and 24B. A plurality of claws 31a extending toward the center from the peripheral surface of the through-hole 31 is formed in the through-hole 31 similarly to the through-hole 31 illustrated in FIG. 16. Moreover, a convex portion 35 is formed on a surface of the shield plate 70 on the side closer to the semiconductor elements (chips) 15 and 16 when the shield plate 70 is attached to the outer case 10.

This is the same as the shield plate 60 of the sixth embodiment illustrated in FIGS. 24A and 24B. Further, the shield plate 70 includes the slit 32 that is formed around the through-hole 31. The slit 32 is the difference from the shield plate 60 of the sixth embodiment.

The slits 32 are formed near the through-holes 31 at positions closer to the center of the shield plate 70 than the through-holes 31. The slit 32 of the present embodiment illustrated in FIGS. 26A and 26B has the same configuration as the slit 32 of the shield plate 40 described with reference to FIG. 19 in the fourth embodiment and provides the same advantageous effects. Thus, redundant description of the slit 32 described in the fourth embodiment will not be provided.

The shield plate 70 of the present embodiment provides a vibration suppressing effect, a thermal deformation suppressing effect, and a heat radiation effect due to the convex portions 35. Moreover, the slits 32 allow the convex portions 11a of the supports 11 to be easily aligned with respect to the positions of the through-holes 31. Further, it is possible to facilitate the operation of inserting the convex portions 11a of the supports 11 into the through-holes 31.

The supports 11 for fixing the shield plate 70 may be provided on the upper surface of the busbar block 25 illustrated in FIG. 25. The supports 11 provided on the upper surface of the busbar block 25 have lower positional accuracy than the supports 11 provided on the outer case 10. Thus, the shield plate 70 preferably has the slits 32 because, when the supports 11 for fixing the shield plate 70 are formed on the upper surface of the busbar block 25, the operation of inserting the convex portions 11a of the supports 11 provided on the upper surface of the busbar block 25 into the through-holes 31 is facilitated.

FIGS. 27A to 27F illustrate modifications of the shield plate 70. The shield plates 70A to 70F illustrated in FIGS. 27A to 27F are example in which the positions and the number of convex portions 35 are different as compared to the shield plate 70 illustrated in FIGS. 26A and 26B. In the shield plate 70A illustrated in FIG. 27A, the convex portions 35 are three linear portions extending in parallel along the longitudinal direction of the shield plate 70A and are arranged in two lines in the longitudinal direction of the shield plate 70A. In the shield plate 70B illustrated in FIG. 27B, the convex portions 35 are three linear portions extending in parallel along the longitudinal direction of the shield plate 70B. In the shield plate 70E illustrated in FIG. 27E, the convex portions 35 are X-shaped portions extending in a diagonal direction of the shield plate 70E. In the shield plate 70F illustrated in FIG. 27F, the convex portions 35 are a combination of three linear portions extending in parallel along the longitudinal direction of the shield plate 70F and two linear portions provided with these convex portions interposed so as to extend in parallel along the lateral direction of the shield plate 70F. In the shield plate 70C illustrated in FIG. 27C, the convex portions 35 are four linear portions extending in parallel along the longitudinal direction of the shield plate 70C, and the convex portions located close to the ends are arranged in two lines in the longitudinal direction of the shield plate 70C. In the shield plate 70D illustrated in FIG. 27D, the convex portions 35 are four linear portions extending in parallel along the longitudinal direction of the shield plate 70D. The positions and the number of convex portions 35 can be appropriately changed according to an inner structure of the outer case 10.

EXPLANATION OF REFERENCE NUMERALS 1, 2, 3, 4: Semiconductor device
10: Outer case 11: Support
12: Annular fastener
13, 14: Terminal (Screw terminal)
15, 16: Semiconductor element (Semiconductor chip)
17: Insulating substrate
18: Bonding wire
19: Metal substrate
20: Control circuit board
25: Busbar block
30, 30A, 40, 50, 60, 70: Shield plate
31, 33: Through-hole
32: Slit
34: Notch
35: Convex portion
36: Sealing material

What is claimed is:

1. A semiconductor device comprising:
an outer case including a protruding member protruding upwardly therefrom;
a semiconductor element accommodated in the outer case;
a control circuit board fixed to the outer case at a position away from the semiconductor element;
a shield plate having a through-hole and provided between the semiconductor element and the control circuit board;
a support separately formed from the protruding member, and having a base portion accommodated in the outer case and a convex portion protruding from the base portion to the control circuit board through the through-hole, the base portion having a diameter larger than that of the convex portion and supporting the shield plate thereon, and the convex portion supporting a rear surface of the control circuit board at an upper portion thereof;
a first fixing member engaging the convex portion to fix the shield plate on the base portion; and
a second fixing member engaging the protruding member or the convex portion to fix the control circuit board to the outer case,
wherein the convex portion is longer than a thickness of the shield plate.

2. The semiconductor device according to claim 1, wherein the first fixing member is an annular fastener attached to the convex portion of the support protruding through the through-hole of the shield plate.

3. The semiconductor device according to claim 1, wherein the first fixing member is a claw provided in the through-hole of the shield plate.

4. The semiconductor device according to claim 3, wherein the shield plate has a slit formed around the through-hole.

5. The semiconductor device according to claim 3, wherein the shield plate has a notch formed between the through-hole and an edge of the shield plate.

6. The semiconductor device according to claim 1, further comprising a sealing material filled in the outer case,
wherein the shield plate has a convex formed on a rear surface thereof facing the semiconductor element and contacting the sealing material to suppress vibration and thermal deformation of the sealing material.

7. The semiconductor device according to claim 1, wherein the shield plate is provided in the outer case.

8. The semiconductor device according to claim 1, wherein the support is made from a resin.

9. The semiconductor device according to claim 1, wherein the second fixing member engages the convex portion; and
the control circuit board has a through-hole, the support further includes a protruding portion protruding from a flat portion of the convex portion through the through-hole formed in the control circuit board, the second fixing member is an annular fastener, and the annular fastener is attached to the protruding portion to fix the control circuit board between the flat portion and the annular fastener.

10. The semiconductor device according to claim 1, wherein the protruding member is a screw seat, and the second fixing member is a screw engaging the protruding member.

11. The semiconductor device according to claim 1, wherein the first fixing member engages the convex portion at a lower portion thereof to sandwich the shield plate between a flat portion of the base portion and the first fixing member, and the second fixing member engages the protruding member or the convex portion at an upper portion thereof.

* * * * *